(12) United States Patent
Zheng et al.

(10) Patent No.: US 7,164,901 B2
(45) Date of Patent: Jan. 16, 2007

(54) DC OFFSET-FREE RF FRONT-END CIRCUITS AND SYSTEMS FOR DIRECT CONVERSION RECEIVERS

(75) Inventors: Yuanjin Zheng, Singapore (SG); Chin Boon Tear, Singapore (SG); Sheng Jau Wong, Johor Bahru (MY)

(73) Assignee: Agency for Science, Technology and Research, Singapore (SG)

( * ) Notice: Subject to any disclaimer, the term of this patent is extended or adjusted under 35 U.S.C. 154(b) by 504 days.

(21) Appl. No.: 10/746,200

(22) Filed: Dec. 24, 2003

(65) Prior Publication Data

US 2005/0143028 A1 Jun. 30, 2005

(51) Int. Cl.
H04B 1/26 (2006.01)
(52) U.S. Cl. ............... 455/324; 296/323; 296/334; 375/320; 375/349
(58) Field of Classification Search ............... 455/63.1, 455/67.11, 67.13, 130, 209, 295, 296, 323, 455/324, 334, 339; 375/320, 322, 349
See application file for complete search history.

(56) References Cited

U.S. PATENT DOCUMENTS

| | | | | |
|---|---|---|---|---|
| 5,438,692 | A * | 8/1995 | Mohindra | 455/324 |
| 5,918,167 | A | 6/1999 | Tiller et al. | 455/310 |
| 6,148,184 | A | 11/2000 | Manku et al. | 455/110 |
| 6,335,656 | B1 | 1/2002 | Goldfarb et al. | 327/559 |
| 6,407,630 | B1 | 6/2002 | Yao et al. | 330/9 |
| 6,504,884 | B1 | 1/2003 | Zvonar | 375/346 |
| 6,516,185 | B1 | 2/2003 | MacNally | 455/234.1 |
| 6,535,725 | B1 | 3/2003 | Hatcher et al. | 455/317 |
| 6,707,860 | B1 * | 3/2004 | Sevenhans | 375/319 |
| 6,771,945 | B1 * | 8/2004 | Pickett et al. | 455/324 |
| 6,862,439 | B1 * | 3/2005 | Feng | 455/234.1 |
| 2002/0181619 | A1 | 12/2002 | McCune, Jr. | |
| 2003/0062951 | A1 | 4/2003 | Twomey | |

OTHER PUBLICATIONS

"Design Considerations for Direct-Conversion Receivers", by Behzad Razavi, IEEE Trans. on Circuits and Systems-II: Analog and Digital Signal Processing, vol. 44, No. 6, Jun. '97, pp. 428-435.
"Direct-Conversion Radio Transceivers for Digital Communications", A.A. Abidi, IEEE Jrnl. of Solid-State Circuits, vol. 30, No. 12, Dec. 1995, pp. 1399-1410.

(Continued)

Primary Examiner—Quochien B. Vuong
(74) Attorney, Agent, or Firm—Saile Ackerman LLC; Stephen B. Ackerman

(57) ABSTRACT

A DCR RF front-end removes the DC term resulting from mixer port to port leakage and feeds RF and LO signals into the mixers with different phase combinations. The signal inputs to the mixers result in the intermediate frequency (IF) output of mixers being 180 degrees out of phase and their DC terms in phase. When subtracting the two outputs from each other the IF signals add up while the DC terms cancel giving a DC free output. A DC offset feedback tuning loop detects the DC offset in the IF domain and then feeds back the tuning voltage to current injection mixers. A multiplier cancels the IF signals and amplifies the DC offset and a comparator compares the amplified DC offset with a threshold voltage and controls the gain of current injection mixers. The feedback tuning loop thus tracks time-varying DC offsets in real-time.

42 Claims, 17 Drawing Sheets

OTHER PUBLICATIONS

"A 2GHz Balanced Harmonic Mixer for Direct-Conversion Receivers," Yamaji et al., IEEE 1997 Custom Integrated Circuits Conf., pp. 193-196.

"A 900MHz CMOS Balanced Harmonic Mixer for Direct Conversion Receivers," by Zhang et al., IEEE CICC, pp. 219-222, 2000.

"A Single-Chip 2.4-GHz Direct-Conversion CMOS Receiver for Wireless Local Loop using Multiphase Reduced Frequency Conversion Technique," IEEE Jrnl. of Solid-State Circuits, vol. 36, No. 5, May 2001, pp. 800-809.

"A 2.4-GHz CMOS Receiver for IEEE 802.11 Wireless LAN's," Razavi, IEEE Jrnl. of Solid-State Circuits, vol. 34, No. 10, Oct. 1999, pp. 1382-1385.

"A Wide-Band Direct Conversion Receiver for WCDMA Applications", Parssinem et al., IEEE Int'l Solid-State Circuits Conf. 1999, pp. 220-221.

Adaptive Compensation for Imbalance and Offset Losses in Direct Transactions on Vehicular Technology, vol. 42, No. 4, Nov. 1993, pp. 581-588.

"BER Performance Analysis of a Direct Conversion Receiver", Lindoff et al., IEEE Trans. on Comm., vol. 50, No. 5, May 2002, pp. 856-865.

"Direct-Conversion RF Receiver Design", Namgoong et al. IEEE Trans. on Comm., vol. 49, No. 3, Mar. 2001, pp. 518-529.

"DC offset and IM2 removal in direct conversion receivers", Faulkner, IEE Proc. Comm., vol. 149, No. 3, Jun. 2002, pp. 179-184.

"A Direct-Conversion Receiver for 900 MHz (ISM Band) Spread-Spectrum Digital Cordless Telephone," Hull et al., IEEE Jrnl. of Solid-State Circuits, vol. 31, No. 12, Dec. 1996, pp. 1955-1963.

"A Parallel Structure for CMOS Four-Quadrant Analog Multipliersand Its Application to a 20GHz RF Downconversion Mixer," Hsiao et al., IEEE Jrnl. of Solid-State Circuits, vol. 33, No. 6, Jun. 1998, pp. 859-869.

* cited by examiner

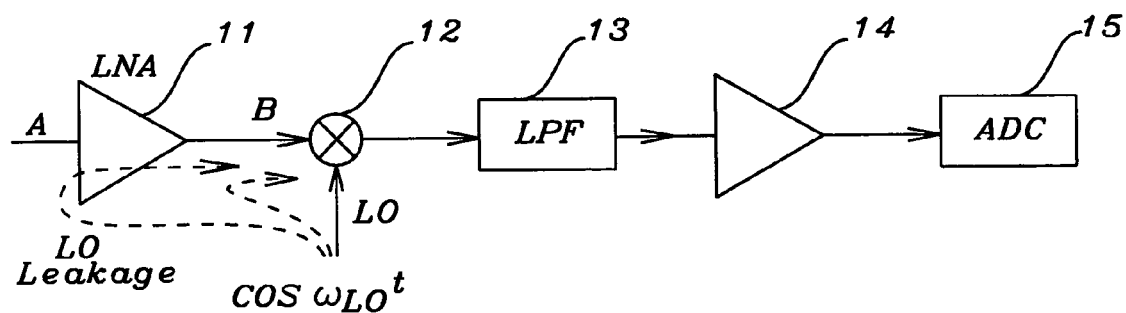
*FIG. 1a — Prior Art*
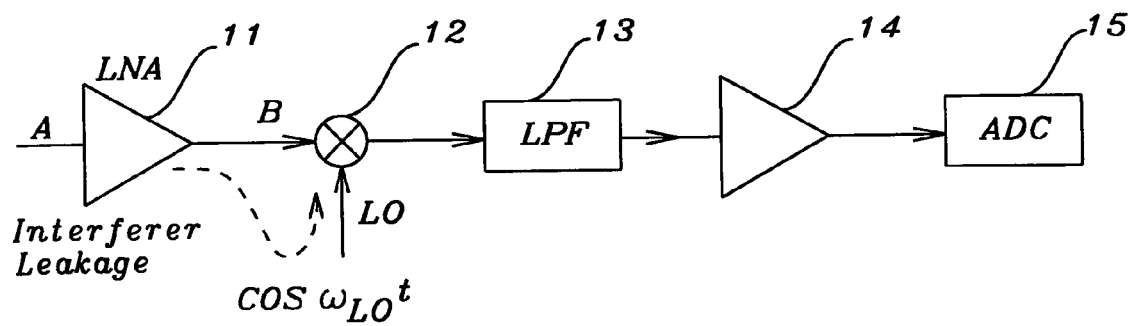
*FIG. 1b — Prior Art*

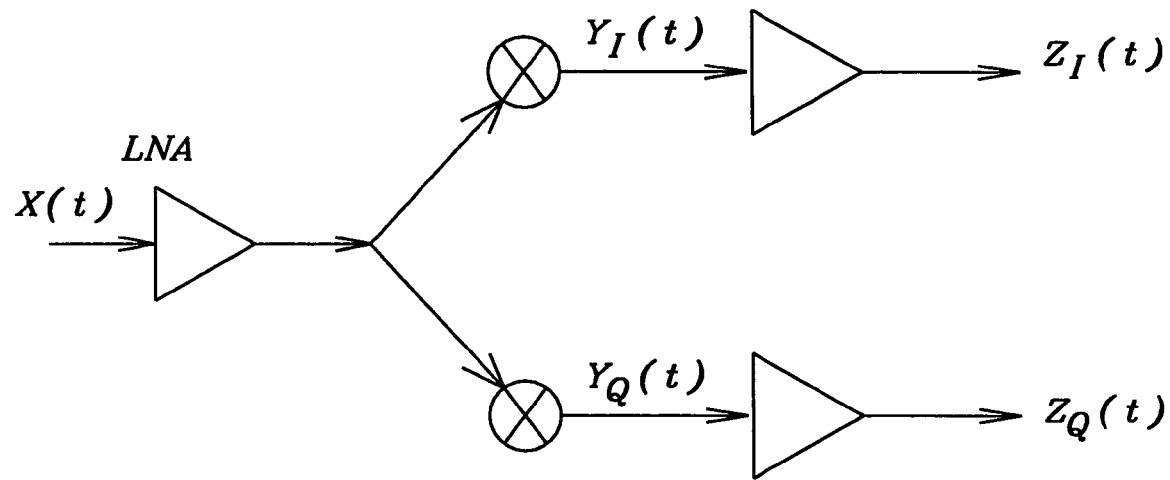
FIG. 18 – Prior Art
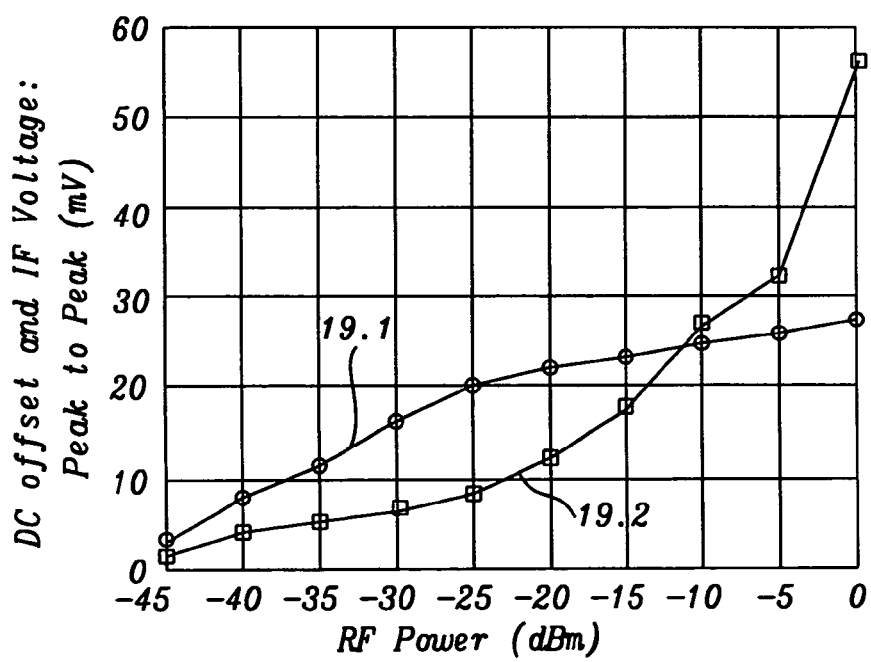
FIG. 19 – Prior Art

DC OFFSET-FREE RF FRONT-END CIRCUITS AND SYSTEMS FOR DIRECT CONVERSION RECEIVERS

BACKGROUND OF THE INVENTION

1. Field of the Invention

The invention relates to wireless RF transceivers, and more particularly to integrated direct conversion transceiver (DCT) front ends with real-time DC offset tracking and cancellation.

2. Description of the Related Art

The applications of RF transceivers have been accompanied with aggressive goals: low cost, low power dissipation, and small form factor. The architecture for wireless transceivers includes three types: superheterodyne, low IF and direct conversion (zero IF). Among them, direct conversion perhaps is the most suitable architecture for IC implementation. The reason is three fold. 1) Direct conversion, in principle, lends itself to monolithic integration much more easily than do others; 2) Direct conversion suffers much less from mismatch-induced effects than does low IF architecture, 3) The integration of direct conversion offers small area, low power consumption, and thus low cost. Refer to B. Razavi, "Design Considerations for Direct-Conversion Receivers", IEEE Transactions on Circuits and Systems-II: Analog and Digital Signal Processing, vol. 44, no. 6, pp. 428–435, June 1997.

A. Abidi, "Direct-Conversion Radio Transceivers for Digital Communications," IEEE Journal of 1997.Solid-State Circuits, vol. 30, no. 12, pp. 1399–1410, December 1995.

It follows that direct Conversion Transceivers (DCT) appear more and more promising and profitable both in the academic world and in industry. Although DCT has many matchless merits, there exist some fatal drawbacks which have prevented its wide usage for many years. These factors mainly include DC offset, I/Q mismatch, even-order distortion, and flicker noise etc, per the above two references. Among these, the DC offset problem may be the biggest one for the DCT in practical applications.

As shown in FIG. 1a (same as FIG. 4 of reference B. Razavi, "Design Considerations for Direct-Conversion Receivers", IEEE Transactions on Circuits and Systems-II: Analog and Digital Signal Processing, vol. 44, no. 6, pp. 428–435, June 1997), the DC offset is mainly produced by self-mixing of downcoversion mixers. Block 11 is a a low noise amplifier (LNA) 11 receiving RF input port A and coupled to mixer 12. The low pass filter (LPF) 13 is coupled to amplifier 14, which coupled to analog-to digital converter (ADC) 15. Local oscillator (LO) is an input, with signal cos $\omega_{LO}t$, to mixer 12. This self-mixing comes from two factors. The first is due to the LO leakage. Owing to the limited isolation between RF input port A and LO input port of mixers (because of various capacitive and substrate coupling, external bonding wire coupling etc.), the leakage signal appearing at the mixer RF input B will self mix with the LO signal, and thus DC offset is produced.

The second is due to the RF interference leakage, as illustrated in FIG. 1b and described next. Note that the same numerals in FIGS. 1a and 1b designate the same component. The received RF signal will also leak to the LO port and then self mixes with itself, which produces undesired DC offset. The DC offset includes fixed as well as time-varying components. Typically, the DC offset signal is larger than the desired signal by 30–40 dB at the mixer output. The gain stage after the mixer provides ~70 dB gain. Thus, if directly amplified by the following stage, the DC offset voltage will block the VGA, and thus prohibits the amplification of the useful signal. As will become apparent in the following text, a practical technique is disclosed which overcomes effectively the DC offset problems for DCT applications.

In the literature, there are already some methods to overcome DC offset problems in DCT. Sub-harmonic mixers and/or even harmonic mixers have been used to overcome the DC offset problems, as discussed in references T. Yamaji and H. Tanimoto, "A 2 GHz Balanced Harmonic Mixer for Direct Conversion Receivers," IEEE customer integrated circuit conference, pp. 193–196, 1997 and Z. Zhang, Z, Cheng and Jack Lau, "A 900 MHz CMOS Balanced Harmonic Mixer for Direct Conversion Receivers," IEEE CICC, pp. 219–222, 2000.

Although these methods can be employed to alleviate the problems in DCT, specific circuit architecture and extra clock circuit have to be used, which cannot ensure to work with high performance in practical applications.

A multiphase frequency synthesizer is also used to provide a LO signal which does not produce the self-mixing and thus can alleviate the DC offset problems in K. Lee et al. "A Single Chip 2.4 Ghz Direct Conversion CMOS Receiver for Wireless Local Loop using Multiphase Reduced Frequency Conversion Technique," IEEE Journal of Solid-State Circuits, vol. 36, no. 5, pp. 800–809, May 2001.

However, this technique requires a complex PLL circuit and high implementation cost. In the IF domain, to overcome the DC offset problem, three methods have been proposed. One is AC coupling and lowpass-highpass filtering. Refer to B. Razavi, "A 2.4 GHz CMOS Receiver for IEEE 802.11 Wireless LAN's," IEEE Journal of Solid-State Circuits, vol. 34, no. 10, pp. 1382–1385, October 1999.

This method can filter out of fixing DC offset due to LO leakages but cannot overcome the time-varying DC offset components. The second is the servo feedback amplifier which can track and tackle all kinds of DC offsets. See A. Parssinen etc., "A Wide-Band Direct Conversion Receiver for WCDMA Applications," ISSCC99, pp. 220–221, 1999 and C. D. Hull, J. L. Tham and R. R. Chu, "A Direct-Conversion Receiver for 900 MHz (ISM Band) Spread Spectrum Digital Cordless Telephone," IEEE Journal of Solid-State Circuits, vol. 31, no. 12, pp. 1955–1963, December 1996.

However a large capacitor (~100 nF) has to be used which cannot be integrated and occupies a large area.

The last is the digital signal processor (DSP) feedback compensation method. See references J. K. Cavers and M. W. Liao, "Adaptive Compensation for Imbalance and Offset Losses in Direct Conversion Transceivers," IEEE Transactions on vehicular technology, vol. 42, no. 4, November 1993, pp. 581–588.

B. Lindoff and P. Malm, "BER Performance Analysis of Direct Conversion Receiver," IEEE Transactions on Communications, vol. 50, no. 5, pp. 856–865, May, 2002, and W. Namgoong and T. H Meng, "Direct-Conversion Rf Receiver Design," IEEE Transactions on Communications, vol. 49, no. 3, pp. 518–529, March 2001.

This method can accurately estimate the DC offset in the baseband and then cancel them in the analog domain. The main shortcoming of this method is that it has to employ an extra ADC/DAC circuit and baseband signal processing circuit so that the implementation cost is high. Since closed loop feedback tuning has to be used, the problem of loop setting time and stability need to be carefully designed for this method.

The forward DC offset and IM2 interference cancellation maybe done using adaptive filtering algorithm in the baseband as discussed in M. Faulkner, "DC offset and IM2 removal in direct conversion receivers," IEE Proc. Communication, vol. 149, no. 3, June 2002, pp. 179–184.

However, the algorithm complexity and speed have to be compromised with the performance. To achieve real-time DC offset tracking and cancellation, a simple algorithm but with good performance has to be developed.

U.S. Patents or U.S. Patent Applications relating to the subject at hand are:

In U.S. Pat. No. 6,516,185 (MacNally), DC offset canceling is done through a variable gain amplifier. The feed forward canceller is used.

In U.S. Patent Application Publication 0,062,951 (Twomey), through current splitting and tuning, a mixer/amplifier circuit is invented capable of providing variable gain while maintaining a substantially constant common mode operating voltage level.

In U.S. Pat. No. 6,335,656 (Goldfarb et al.), the DC offset is canceled by a series of highpass filters which have lower and lower cutoff frequencies.

In U.S. Pat. No. 6,407,630 (C. T. Yao et al.) a DC offset canceling circuit is integrated with a VGA. Large capacitors have to be used in the feedback loop to store and cancel the DC offset at the input of VGA.

In U.S. Patent Application Publication 0,181,619 (E. W. McCune JR.), the LO signal is adaptively adjusted to be in quadrature with RF signals so that the DC offset can be canceled. The accuracy of this method is limited by the matching of circuits in practical applications.

In U.S. Pat. No. 6,504,884 (Zvonar) a method is proposed which can estimate the DC offset as well as the channel impulse response in baseband. Both the DC offset and channel ISI can be overcome. This method is suitable to eliminate the small residue DC offset in baseband but cannot deal with the large DC offset in an RF front-end.

In U.S. Pat. No. 5,918,167 (Tiller et al.,) the DC offset is detected in the mixer output and then fed back to the mixer input to cancel the DC offset. Since low pass filter (LPF) and automatic gain control (AGC) circuits have to be used, the DC cancellation accuracy will be limited by the choice of LPF cutoff frequency and AGC dynamic range and resolution.

In U.S. Pat. No. 6,535,725B2 (G. Hatcher et al.) DC offset is detected at the input of mixers. A compensator is used to cancel the DC offset at the output of the mixers. To detect the DC offset, an extra known interference testing signal has to be employed. The compensator includes a complex controller and a corrector. Thus the whole cost of the DC offset cancellation system is high. Moreover, the DC offset cancellation accuracy of this patent is limited by the adjusting step size (minimum current bit).

In U.S. Pat. No. 6,148,184 (T. Manku et al.) quadrature baseband signals are produced by mixing a RF signal with quadrature LO signals. A total of six mixers is needed for I/Q downconversion. To overcome DC offset, LO signals have to be modulated by an extra phase modulated (PM) signal. The performance of the patent is limited by the choice of the frequency of PM signals and phase accuracy between mixer M1(M2) and mixer M3.

To overcome the problems and disadvantages of the above cited related art, we are proposing the following solutions:

(1) a new architecture named DC Offset-Free DCR RF Front-End with Symmetrical Mixer to overcome the DC offset problem. Through this new architecture the desired signal will be enhanced and the DC offset will be cancelled automatically at the output of the RF front-end of a direct-conversion receiver. In contrast to the methods of the related art above, the common mixers such as the Gilbert cell can be adopted and no specific circuit is needed. The DC offset cancellation performance is guaranteed both in theory and simulation, and its actual performance is only limited by the process mismatch in practical applications.

(2) a new RF Front-End DC Offset Feedback Tuning Loop circuit which can combine the RF front-end with baseband tuning circuits to overcome DC offsets when viewed as a system. A feedback tuning loop circuit is developed which can detect the DC offset in the analog baseband and then feeds back the tuning voltage to RF mixers to cancel the DC offset. The current-tuning technique of active mixers is proposed here for the first time and can track the time-varying DC offset and cancel it in real-time. The complete DC offset cancellation technique, by integrating these two methods in a direct conversion receiver, not only can cancel large (burst) and small DC offset due to LO and/or RF leakage, but also can overcome the time-varying DC offset when the receiver moves, i.e., changes physical location (such as a person carrying a cell-phone in a car for example). No external capacitor and components are needed. The proposed front-end can be implemented in low cost processes, such as CMOS, but with high performance (high DC offset rejection, fast setting time, etc.).

SUMMARY OF THE INVENTION

It is an object of at least one embodiment of the present invention to provide circuits and methods to overcome the DC offset problems of a DCR RF front-end and to provide a feedback tuning loop to overcome DC offsets in a system environment.

It is another object of the present invention to provide these features at low cost and high performance.

It is yet another object of the present invention to provide these features using common building blocks, e.g. such as polyphase filters, Gilbert cells, mixers, buffers, multipliers, comparators, preamplifiers, etc.

It is still another object of the present invention to integrate a feedback DC offset tuning system with a DC offset-free RF front-end.

It is a further object of the present invention is to track the time-varying DC offset in real-time.

It is yet a further object of the present invention is to cancel large (burst) and small DC offset due to LO and/or RF leakage.

It is still a further object of the present invention is to eliminate the use of external capacitors and external tuning circuits.

These and many other objects have been achieved by:
a) a DCR RF front-end which removes the DC term resulting from mixer port to port leakage (RF-RF and LO-LO signals), and feeds the RF and LO signals into the mixers with different phase combinations. The signal inputs to the mixers result in the intermediate frequency (IF) output of mixers being 180 degrees out of phase and their DC terms in phase. As such, when the two outputs are subtracted from each other using the combiner, the IF signals add up while the DC terms cancel each other giving a DC free output, and b) a DC offset feedback tuning loop which detects the DC offset in the IF domain and then feeds back the tuning voltage to current injection mixers. The loop comprises
a multiplier, receiving inputs from the combiners, which reduces the multiplied I and Q IF signals and amplifies the DC offset,
an adaptor which converts the output to a single ended signal,
a limiter to cut off the tuning voltage when it changes to the undesired region,
a comparator to compare the amplified DC offset voltage to a threshold voltage and to control the gain of current injection mixers.

The feedback tuning loop thus can track time-varying DC offsets in real-time

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIGS. 1a and 1b are a block diagrams illustrating the self-mixing of downconversion mixers.

FIG. 18 is a block diagram of a conventional mixer of the prior art.

FIG. 19 is a graph of the measured IF output and DC offset of the mixer of FIG. 18.

Use of the same reference number in different figures indicates similar or like elements.

DESCRIPTION OF THE PREFERRED EMBODIMENT

The invention includes two parts: a DC offset-free DCR RF front-end with symmetrical mixer and a RF front-end DC offset feedback tuning loop. These two parts can be used in combination or separately depending on the different applications.

DC Offset-Free DCR RF Front-End with Symmetrical Mixer

Figure 2:
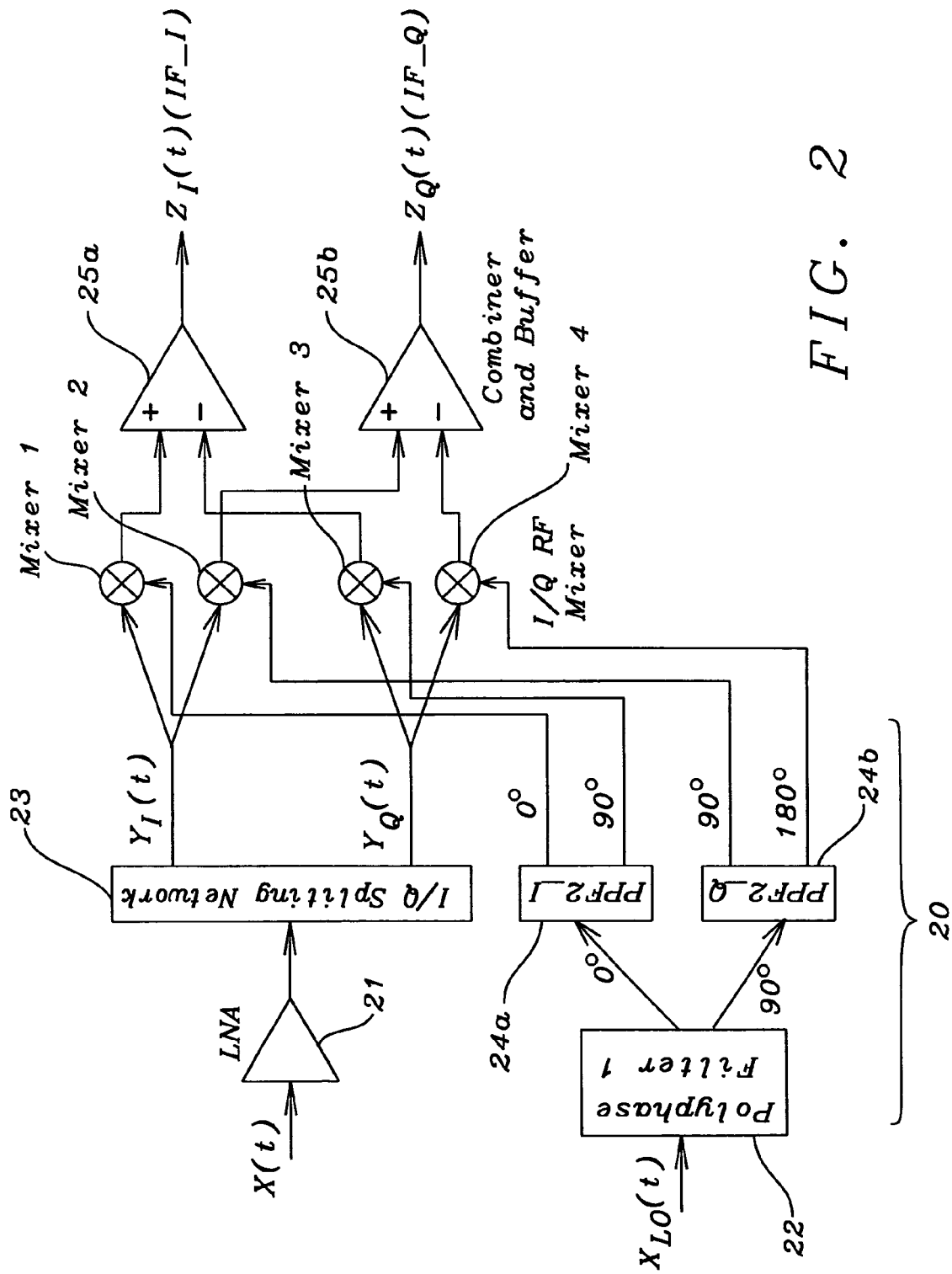
FIG. 2 is a block diagram of the DCR front-end of the present invention.

The proposed DC Offset-Free direct conversion receiver (DCR)RF front-end consists of four identical mixers, i.e. the mixers are symmetrical, and phase shifting networks for both the radio frequency (RF) incoming signal and the local oscillator (LO) signal. The system block diagram of the DCR front-end is shown in FIG. 2, which is described in more detail next. Stage 20 comprises low noise amplifier (LNA) 21, polyphase filter(PPF) 22, I/O Splitting Network 23, and polyphase filters 24a and 24b. Input X(t) is coupled via LNA 21 to the I/O Splitting Network 23. Input X_LO(t) is coupled via polyphase filter 22 to PPF2_I 24a with phase 0 degree and to PPF2_Q 24b with phase 90 degree. The output Y_I(t) of network 23 feeds mixers 1 and 2. The output Y_Q(t) of network 23 feeds mixers 3 and 4. Mixers 1-4 are I/Q RF mixers. PPF2_I 24a feeds mixer 1 with a 0° signal and mixer 3 with a 90 degree signal. PPF2_Q 24b feeds mixer 2 with a 90 degree signal and mixer 4 with a 180 degree signal. Mixers 1 and 3 feed Combiner and Buffer 25a and Mixers 2 and 4 feed Combiner and Buffer 25b. Signals Z_I(t)=IF_I and Z_Q(t)=IF_Q are the outputs of 25a and 25b, respectively.

The main problem with DCR systems is the generation of DC terms due to self-mixing of downconversion mixers, see FIG. 1. These DC terms could cause subsequent blocks to reach saturation thereby reducing their sensitivity to the desired incoming signal. In this proposed architecture, self-mixing due to two types of signal leakages are the main concern. The first being mixer port to port leakage due to parasitic capacitance and substrate coupling. The second is the leakage of the LO signal to the LNA through substrate coupling or through the antenna including LO signals which reflect from objects and are picked up by the antenna.

To remove the DC term resulting from mixer port to port leakage, the RF and LO signals are fed into the mixers with different phase combinations. Their resulting outputs are then combined to cancel the DC term. The signal inputs to the mixers, as shown in Table 1, result in the intermediate frequency (IF) output of mixers 1 and 3 (or 2 and 4) being 180 degrees out of phase and their DC terms in phase. As such, when the two outputs are subtracted from each other using the combiner, the IF signals add up while the DC terms cancel each other giving us a DC free output.

TABLE 1

Input signal phase to mixers:

| | RF Phase | LO Phase |
|---|---|---|
| Mixer 1 | 0° | 0° |
| Mixer 2 | 0° | 90° |
| Mixer 3 | 90° | 90° |
| Mixer 4 | 90° | 180° |

To cancel the DC term resulting from leakage to the antenna and LNA, a fully symmetrical mixer was used. This ensures that the signal phase delay from RF or LO port to IF port are equivalent such that the leaked RF (or LO) signal and the RF (or LO) signal maintain a 90 degree phase difference when they mix in the mixers. Hence, no DC offset will be produced since the leaked RF (LO) signal is always in quadrature with the RF (LO) signal when they mix out from the mixers, meaning no additional DC term is added to the desired IF signal.

More details on the building block circuits of the above described DC Offset-Free DCR RF Front-End with Symmetrical Mixer, such as the LNA, the polyphase filter, the mixer, and the output buffer will be presented later in the text where preferred embodiments of circuits will be discussed for the implementation of the proposed system. However, it should be pointed out that other forms of circuits (e.g. mixer, buffer etc.) also can be used in this system without deviating from the intent of this invention.

RF Front-End DC Offset Feedback Tuning Loop

Figure 3:
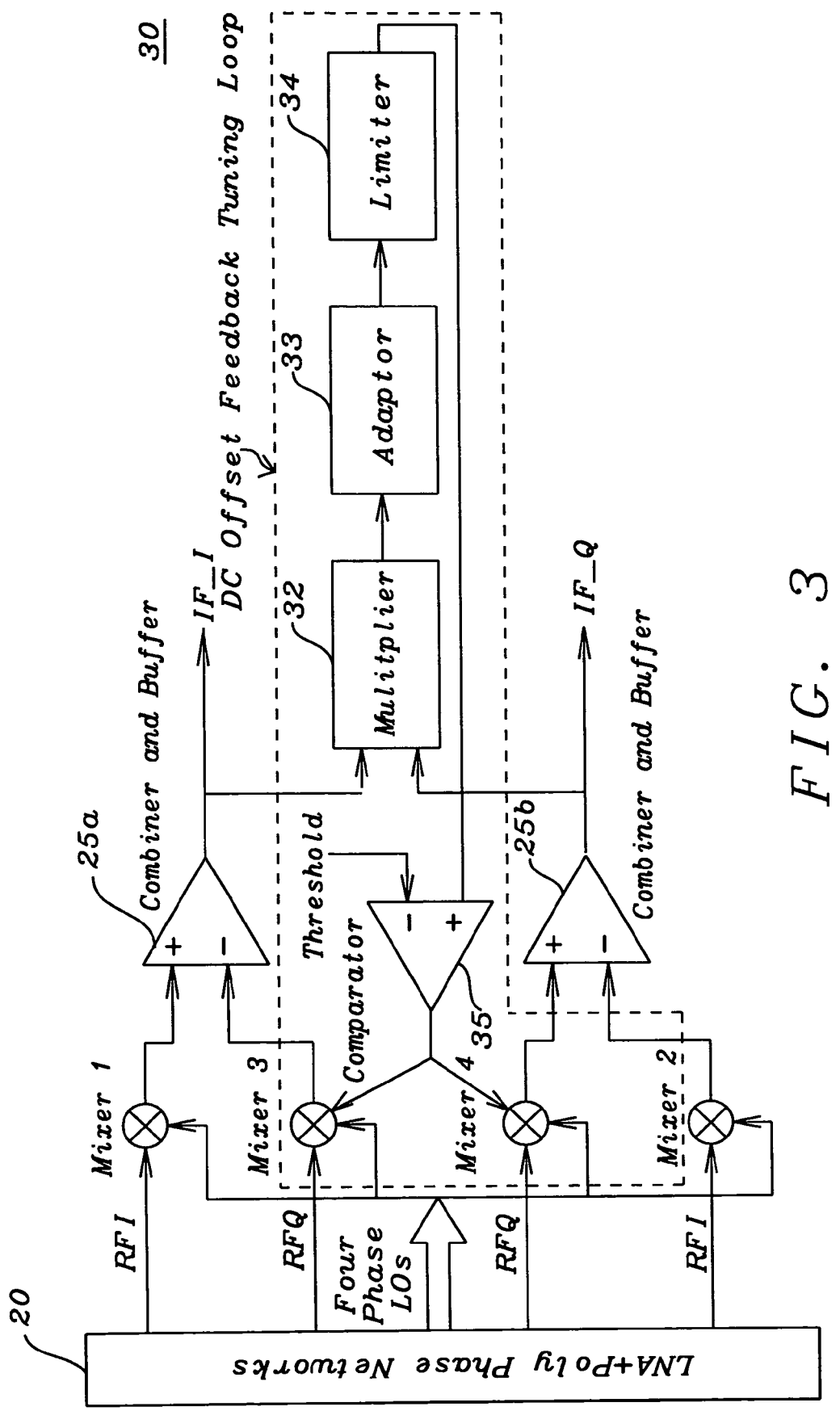
FIG. 3 is a block diagram of the DC offset feedback tuning loop of the present invention.

The proposed DC offset feedback tuning loop is shown in FIG. 3. The I/Q RF signals and four phase LO signals come from the RF front-end as shown in FIG. 2. FIG. 3 comprises Stage 20 of FIG. 2 and the DC Offset Feedback Tuning Loop 30. DC Offset Feedback Tuning Loop 30 comprises, in series, Multiplier 32, Adaptor 33, Limiter 34 and Comparator 35. Multiplier 32 is fed from Combiner and Buffer 25a and 25b. A signal 'Threshold' is applied to the second input of Comparator 35. The output of Comparator 35 feeds additional third inputs of Mixers 3 and 4 of FIG. 2. Signals RFI and RFQ of Stage 20 are equivalent to signals Y_I(t) and Y_Q(t) of block 23 of FIG. 2, respectively. The signal 'Four phase LOs' is equivalent to the outputs of blocks 24a and 24b of FIG. 2.

For tuning purposes, I/Q mixers 3 and 4 are modified and have variable gains through differential current injection which are controlled by a Comparator 35. The other I/Q Mixer 1 and Mixer 2 have fixed gains. Due to process variation, circuit mismatch and time-varying leaked LO (or RF) signals, some DC offset will appear at the Combiner and buffer outputs (IF_I and IF_Q) when the mixers downconvert the RF signals. A Multiplier 32 is used to sense the DC offset. Since the desired I and Q IF signals have 90 degree phase difference, the multiplied value of the desired I and Q IF signals at the output of Multiplier 32 with a low pass filtering will be canceled and the multiplied value of the I and Q DC offset will be amplified. The Adaptor 33 following the multiplier further amplifies the multiplied DC offset value and converts it to a single ended voltage level. This single ended voltage, after passing through Limiter 34 (and described later in the text), is then compared with a threshold voltage through the Comparator 35. A tuning voltage is formed at the output of the Comparator which is used to control the gain of current injection Mixers 3 and 4.

As illustrated in FIG. 3, it is easy to shown the desired IF signal components in $S_I(t)$ and $S_Q(t)$ are in inverse phase, and DC offset components are in phase (same for $P_I(t)$ and $P_Q(t)$). Due to the inevitable process and circuit mismatches, the DC offset of $S_I(t)$ (noted as $d_{SI}(t)$) may be not equivalent to the DC offset of $S_Q(t)$ (noted as $d_{SQ}(t)$). The DC offset at the output of combiner can be represented as $d_{cb}(t)=\alpha(\beta_I d_{SI}(t)-\beta_Q d_{SQ}(t))$, where $\alpha$, $\beta_I$, $\beta_Q$ is the gain mixer, and current injection mixer respectively. Obviously, when the gain of the current injection mixer is changed to $\beta_Q=\beta_I d_{SI}(t)/d_{SQ}(t)$, the DC offset at the output of the combiner will be zero, i.e., $d_{cb}(t)=0$. The tuning voltage coming from the comparator will change the gain of the current injection mixer.

The tuning loop acts as a negative feedback loop, which works as follows. When the combiner outputs IF_I and IF_Q having no DC offset, the output of multiplier will be a fixed common mode voltage $V_{CM}^0$. This voltage is amplified by the adaptor and regulated by the limiter to attain a threshold voltage $V_{TH}^0$ in one of the comparator inputs. Obviously, this threshold voltage corresponds to no DC offset condition. On the other hand, if the DC offset appears at the I/Q combiner outputs due to self-mixing, the output voltage level of the multiplier $V_{CM}$ will be larger than $V_{CM}^0$. $V_{CM}$ is then amplified by the adaptor and regulated by the limiter to attain a voltage $V_{TH}$ which is of course larger than $V_{TH}^0$. When $V_{TH}$ is compared with the threshold voltage $V_{TH}^0$, a tuning voltage is formed which will inject current into the current injection mixers and change their gains. The gains of the current injection mixers are changed in the direction which forces DC offset at the combiner outputs to decrease. This negative feedback will work until DC offset is completely canceled and thus $V_{TH}=V_{TH}^0$. To keep the stability of the tuning loop, a limiter is necessary to be inserted into the loop.

More details on the building block circuits of the above described system RF Front-End DC Offset Feedback Tuning Loop, such as the current injection mixer, the multiplier, the adaptor, and the limiter will be presented later in the text where some alternative circuits will be discussed for the implementation of the proposed system. However, it should be pointed out that other forms of circuits (e.g. current injection mixer, multiplier, adaptor, limiter, etc.) also can be used in this system without deviating from the intent of this invention.

The Low Noise Amplifier (LNA)

The LNA 21 used in the system is a standard cascode amplifier with the source inductively degenerated and an LC tank at the output for frequency selection.

Polyphase Filter

Figure 4:
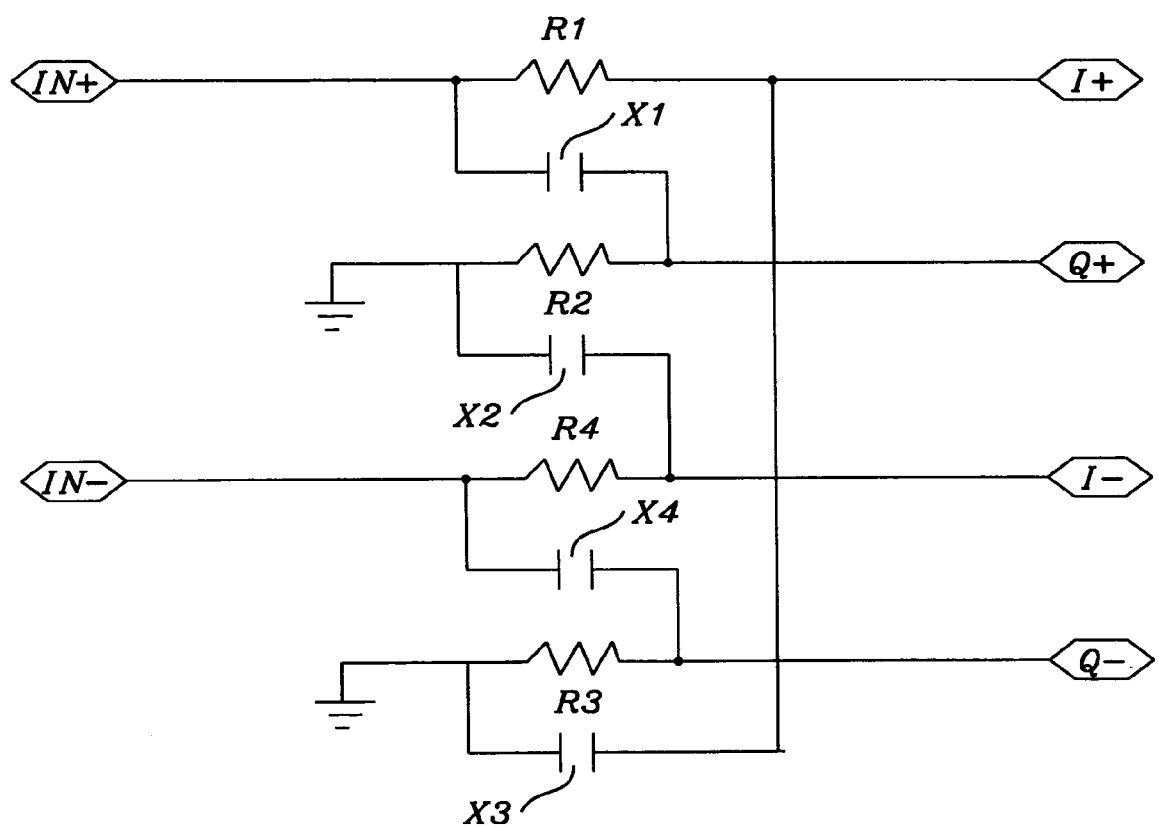
FIG. 4 is a circuit diagram of a typical single stage polyphase filter.

The function of the polyphase filter 22, is to split an input signal equally into two with the output signals being 90° out of phase. The circuit consists of a simple high pass and low pass filter for each input path. At the −3 dB point, the phase of the signal is shifted +45° and −45°, respectively. Thus with the −3 dB point tuned to our desired frequency, we are able to obtain output signals which are equal in magnitude with 90° phase difference. The schematic of the preferred embodiment of a single stage differential polyphase filter is shown in FIG. 4. Inputs are IN+, IN−; outputs are I+, Q+, I−, Q−.

Mixer

Figure 5:
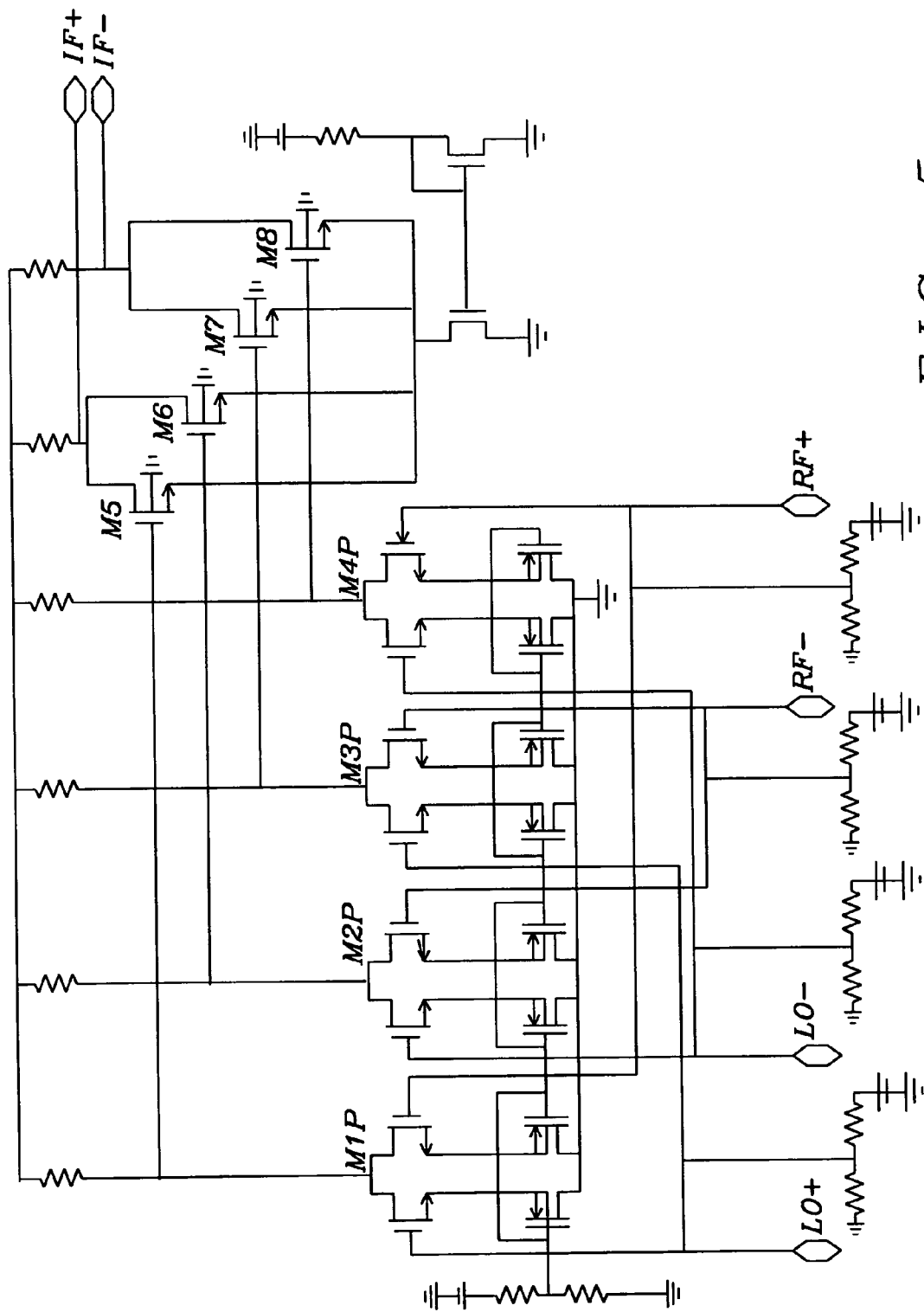
FIG. 5 is a circuit diagram of a symmetrical mixer based on a multiplier.

The function of the mixer (see Mixers 1–4 in FIGS. 2 and 3) is to multiply the RF and LO signals together to obtain the resulting IF signal. The mixer that was used in this proposed architecture is a one, that is the signal phase delay path from the RF and LO inputs to the IF output are exactly the same. The schematic of the preferred embodiment of a fully symmetrical mixer is shown in FIG. 5. Inputs are LO+, LO−, RF+, and RF−; outputs are IF+ and IF−.

The original idea of the mixer architecture was taken from reference "A Parallel Structure for CMOS Four-Quadrant Analog Multipliers and Its Application to a 2 GHz RF Down Conversion Mixer" (S, Y. Hsiao et al., IEEE Journal of Solid-State Circuits, vol. 33, no. 6, June 1998). Some more work has been done to improve the performance for mixer to be more suitable for DCR applications. In Stage 1 (FIG. 5), additional PMOS transistors were added to the source of the inputs NMOS transistors to help improve the isolation between RF and LO input ports. In stage 2 (FIG. 5), an additional tail current source was added to give us an additional degree of freedom to boost the gain.

The operation of the circuit is as follows. When LO+ is high and LO− is low, transistor pairs M1P and M3P are turned on drawing current whereas transistor pairs M2P and M4P are off. This current causes a large voltage drop across the bias resistors turning off their corresponding stage 2 transistors M5 and M7. The RF signal thus flows through the M2P/M4P and M6/M8 paths to the output. Similarly in the next half cycle, LO+ is low and LO− is high, the RF signal flows through M1P/M3P and M5/M7 paths to the output. The process of switching between M1P/M3P and M2P/M4P paths is equivalent to multiplying the RF signal with a square wave thereby achieving signal mixing and downconversion.

Combiner and Buffer

Figure 6:
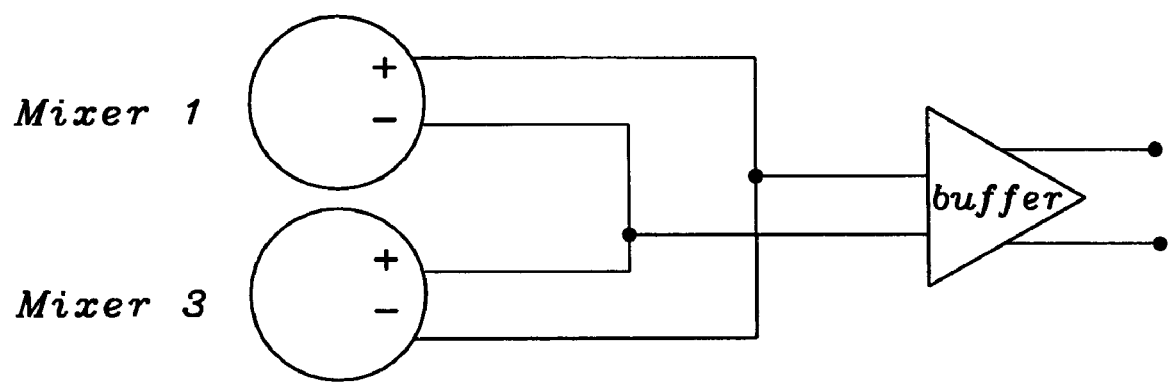
FIG. 6 is a block diagram illustrating the subtraction of two IF signals as used in the present invention.

A preferred embodiment of a combination of mixers and a buffer is illustrated in FIG. 6. Subtraction of the signal from Mixers 1 and 3 was achieved by connecting the opposite outputs of the mixers together and driving buffer 25a (of FIG. 2) as shown in FIG. 6. Similarly, subtraction by the other buffer 25b (of FIG. 2) is done through Mixers 2 and 4.

Figure 7:
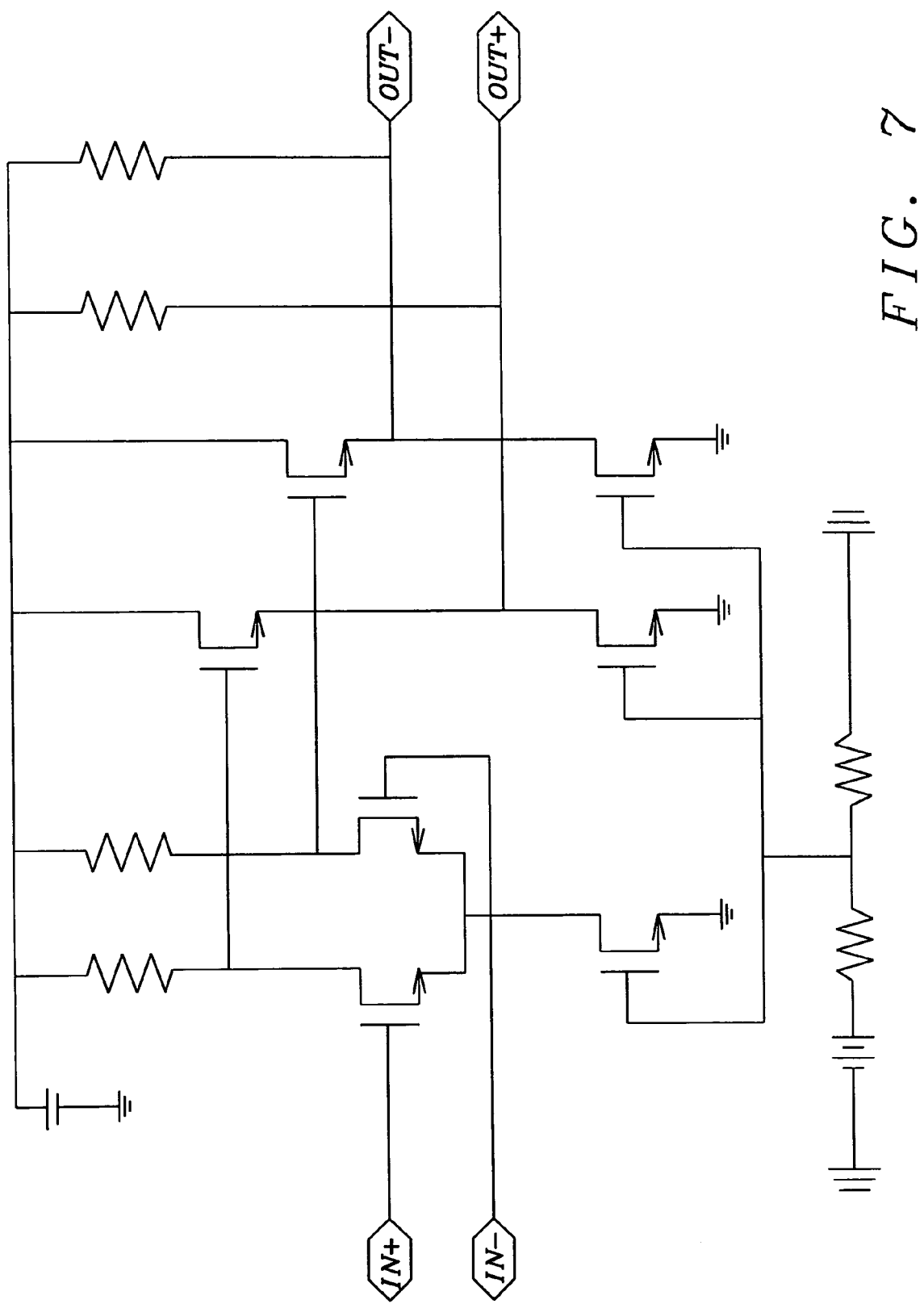
FIG. 7 is a circuit diagram of an output buffer as used in the present invention.

A preferred embodiment of the buffer is a differential amplifier and a source follower output stage. This architecture was chosen so as to enable the buffer to drive a low impedance load with the source follower stage. The schematic of the combiner and buffer is shown in FIG. 7. Inputs are IN+ and IN−, outputs are OUT+ and OUT−.

Current Injection Mixer

Figure 8:
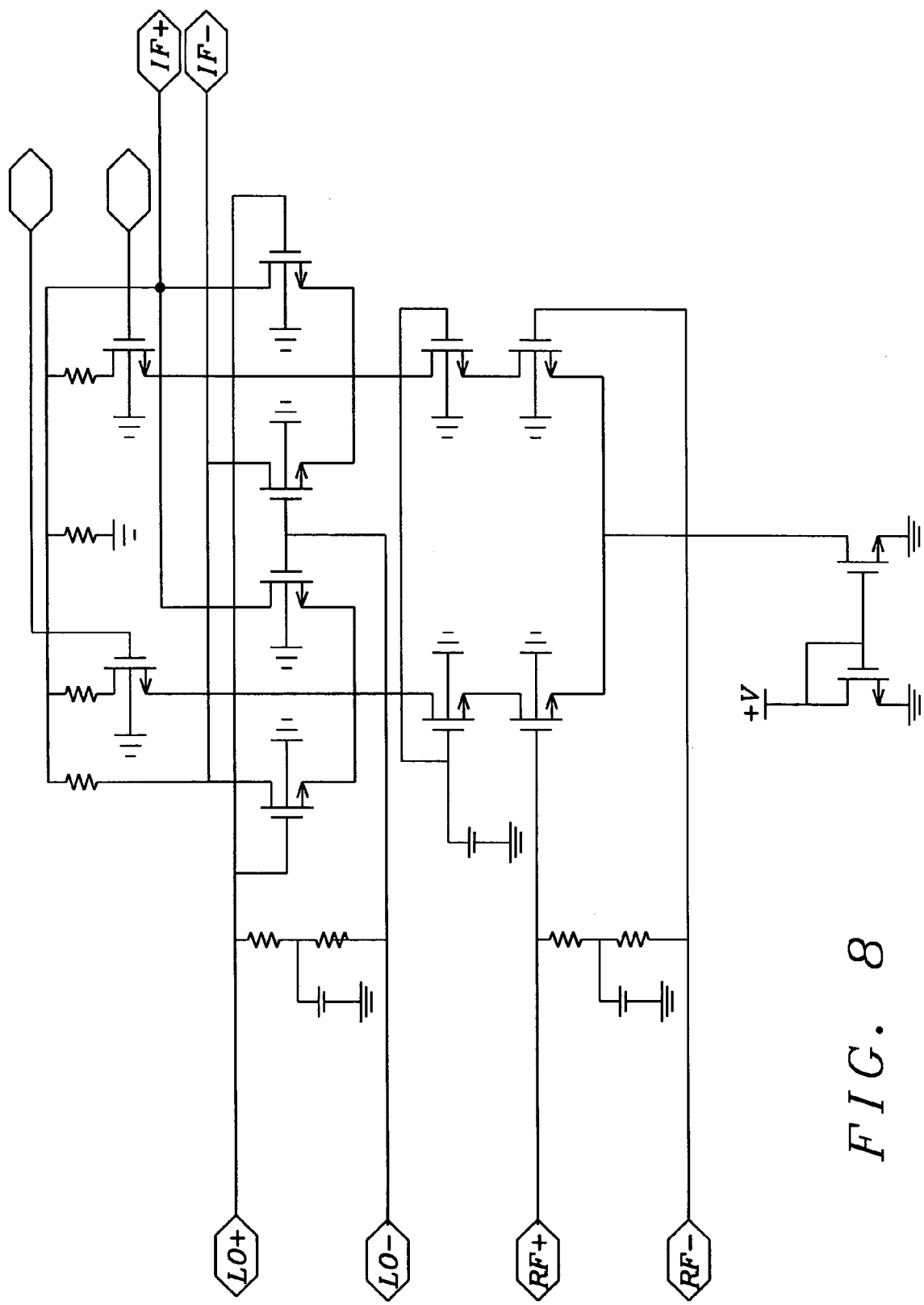
FIG. 8 is a circuit diagram of a current injection mixer as used in the present invention.

A preferred embodiment of the current injection mixer (Mixers 3 and 4 of FIG. 2), shown in detail in FIG. 8, is formed by a Gilbert mixer and two current injection transistors. Inputs are LO+, LO−, RF+, and RF−; outputs are IF+ and IF−. The tuning voltage is connected to the current injection transistors' gate. When the tuning voltage changes, the current injected by the transistors will be changed and the current flowing through the four LO switching transistors (LO1, LO2, LO3, LO4) will also be changed, which will change the conversion gain of the mixer. Another pair of transistors between the LO switching transistors and RF input transistors (RF1, RF2) are included to improve the isolation between the LO and RF ports. In order to prevent the tuning voltage excessively tuning the mixer, a limiter is used to limit the tuning voltage range in the tuning loop. The mixer gain will change linearly when the tuning voltage changes from about 1.3 V to 2.3 V.

Fixed Gain Mixer

The fixed gain mixer (Mixers 1 and 2 of FIG. 2) is a common Gilbert cell. Unlike the variable gain mixer (Mixers 3 and 4) it does not include two current injection transistors.

Multiplier

Figure 9:
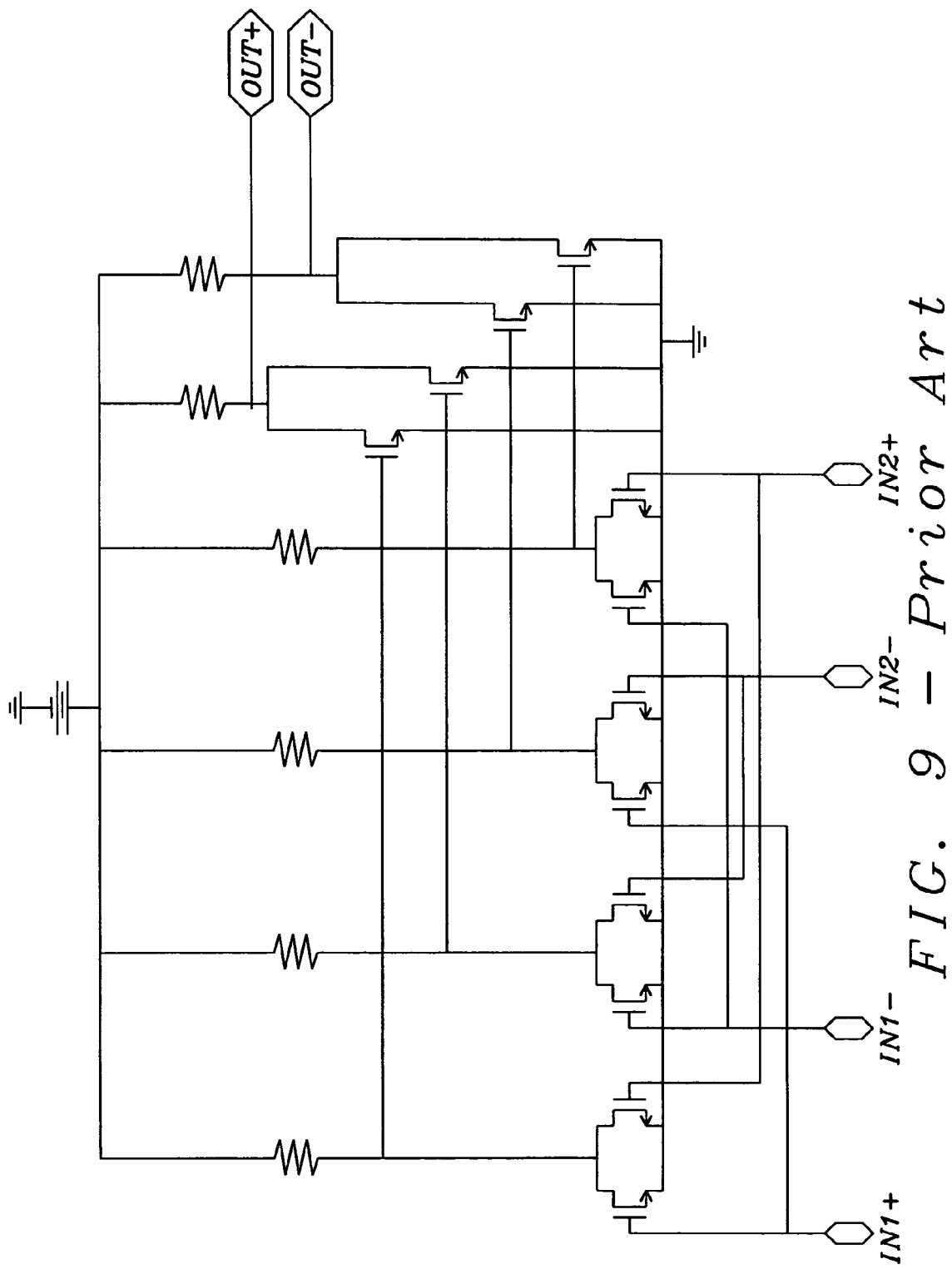
FIG. 9 is a circuit diagram of a multiplier core of the prior art.

The multiplier 32 (of FIG. 3) used in this invention, and shown in a detailed schematic in FIG. 9, refers to the paper "A Parallel Structure for CMOS Four-Quadrant Analog Multipliers and its Application to a 2 GHz RF Down Conversion Mixer" (S, Y. Hsiao et al., IEEE Journal of Solid-State Circuits, vol. 33, no. 6, Jun. 1998). It uses the combiner cell to realize the square function. Six combiner cells are connected as in FIG. 9 (showing the mixer core) to form the multiplication function. This multiplier is fully symmetric so that it can be employed to sense the DC offset and cancel the desired quadrature IF signals in the tuning loop. Inputs are IN1+, IN1−, IN2+, IN2−; outputs are OUT+ and OUT−.

DC Offset Feedback Tuning Loop

Figure 10:
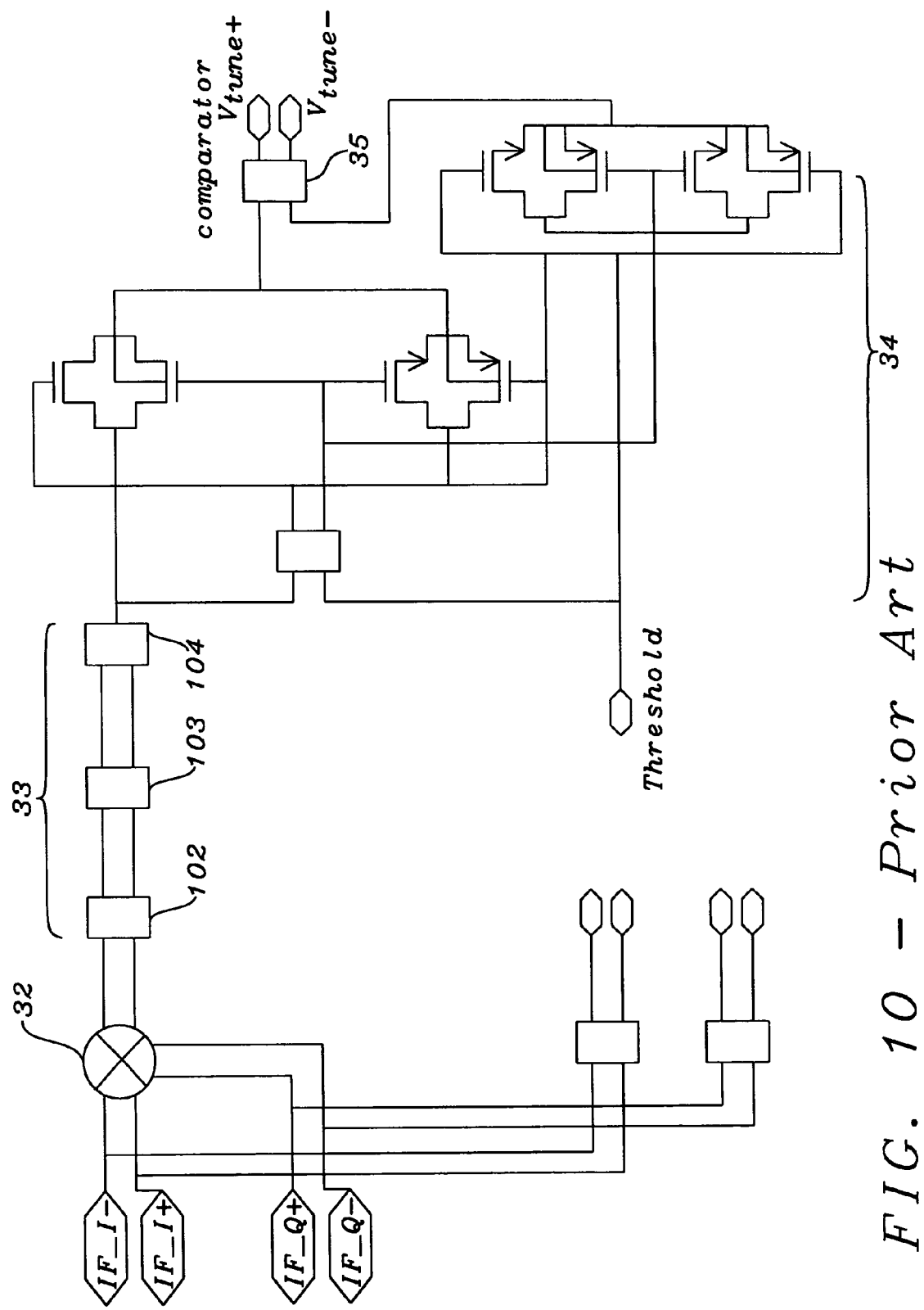
FIG. 10 is a more detailed block diagram of the DC offset feedback tuning loop of the present invention

A preferred embodiment of the complete DC Offset Feedback Tuning Loop setup is shown in FIG. 10, comprising the Multiplier Block 32, the Adaptor Block 33 (comprising blocks 102, 103, and 104), the Limiter 34, and the Comparator Block 35. The circuit diagram of Comparator 35 is shown separately below in FIG. 13. Inputs are IF_I+, IF_I−, IF_Q+, IF_Q− and Threshold; outputs V_tune+ and V_tune−.

Adaptor

Figure 11:
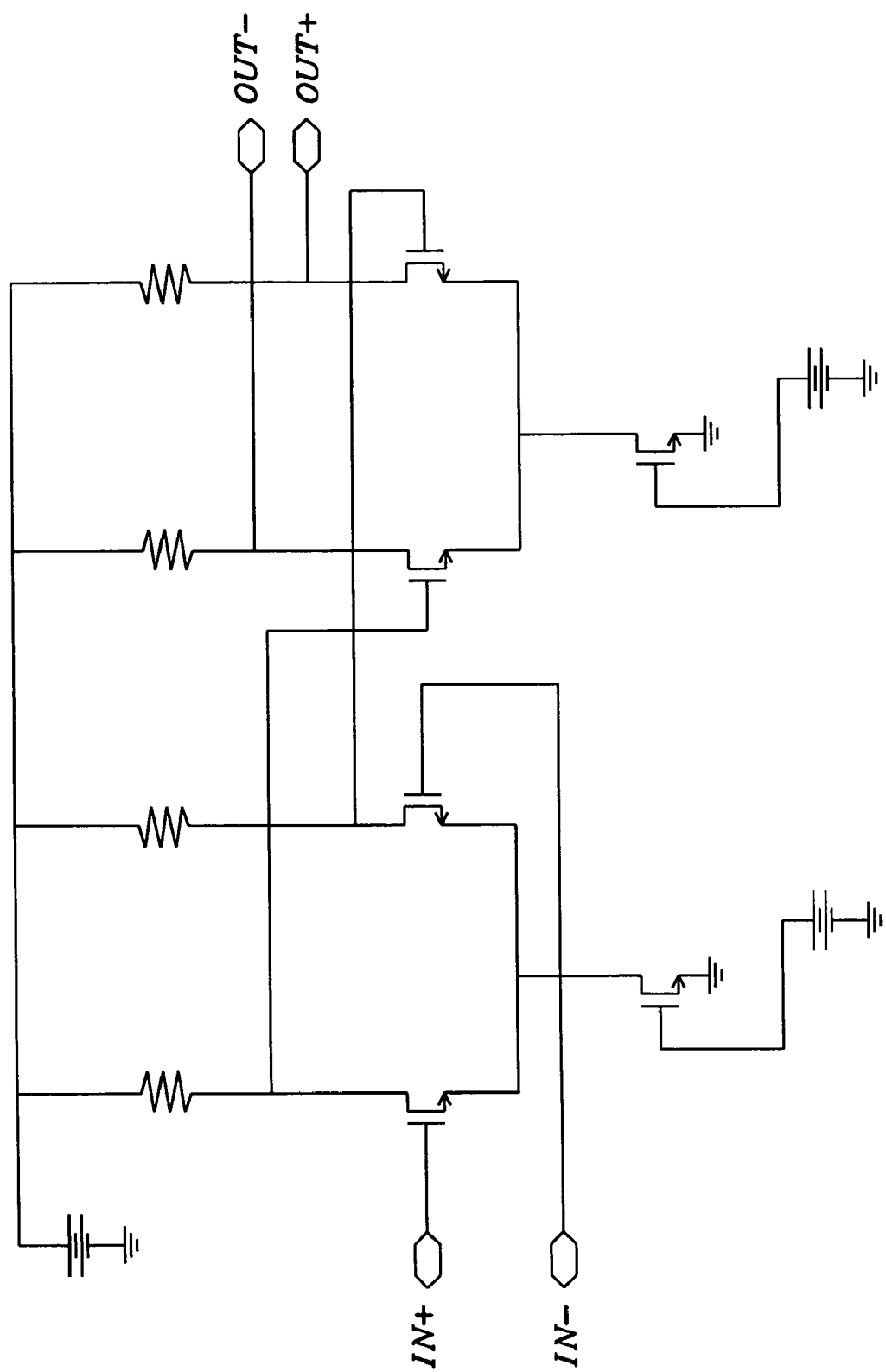
FIG. 11 is a circuit diagram of the preamplifier of the adaptor as used in the present invention.
Figure 12:
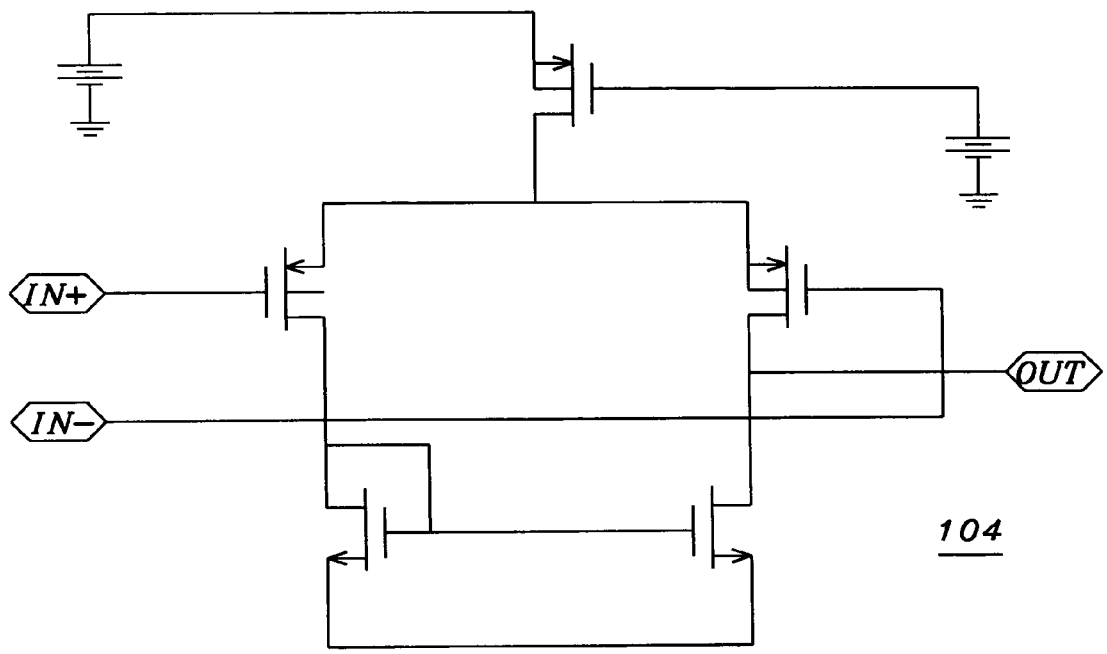
FIG. 12 is a circuit diagram of the differential-to-single ended converter of the adaptor as used in the present invention.

A preferred embodiment of the Adaptor 33 consists of a pre-amplifier 102 (see circuit diagram FIG. 11) with inputs IN+, IN− and outputs OUT+, OUT−, a buffer 103 (no circuit diagram shown), and a differential to single ended converter (see circuit diagram FIG. 12) with inputs IN+, IN− and output OUT, which has a total of 80 to 120 dB low frequency voltage gain. It forms the tuning loop gain stages and decides the tuning sensitivity and convergence. Here the buffer is used to improve the load driving ability, so that the common mode voltage of the buffer output is always fixed whenever the loading changes. It relaxes the DC interfacing specification between the multiplier and the blocks after the adaptor.

Limiter

Two transmission gates are used to form the Limiter 34. The tuning voltage will pass through the limiter to tune the mixer gains when it changes in the normal region. When the tuning voltage changes in the undesired region, the limiter will cut off the tuning voltage directly and only output a fixed voltage to tune the mixer gain. With the limiting of the tuning voltage the current injection mixer will be forced to work properly.

Comparator

Figure 13:
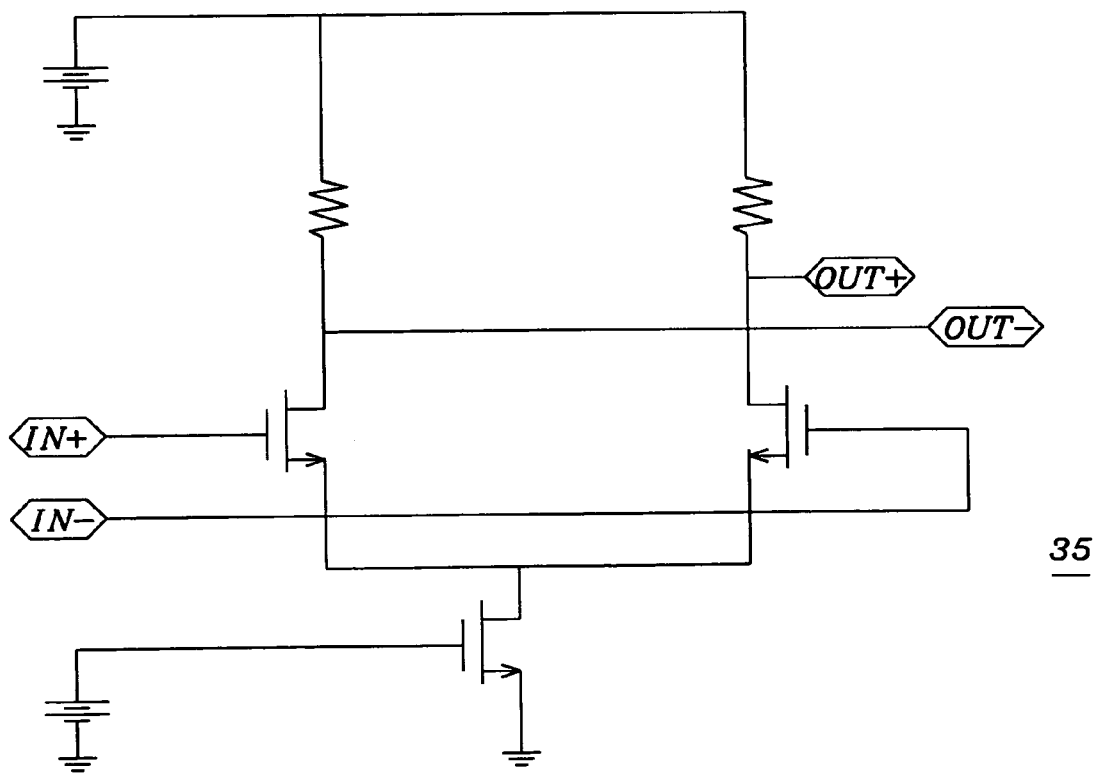
FIG. 13 is a circuit diagram of the comparator as used in the present invention.

A preferred embodiment of a simplified differential amplifier is used as a comparator 35, which compares the amplified DC offset voltage to the threshold voltage and outputs the tuning voltage. The comparator is shown in FIG. 13 and has inputs IN+, IN− and outputs OUT+, OUT−.

Threshold Voltage

The threshold voltage can come from a duplicate mixer with normal (no DC offset) IF common mode voltage as input or from an external voltage source. When the time division multiplex access (TDMA) scheme is adopted, it can also come from the sampling or integration capacitor. Here the threshold voltage determines how much DC offset can be tuned, the range of the residue of DC offset level and the efficiency of DC offset tuning.

Results

Figure 14:
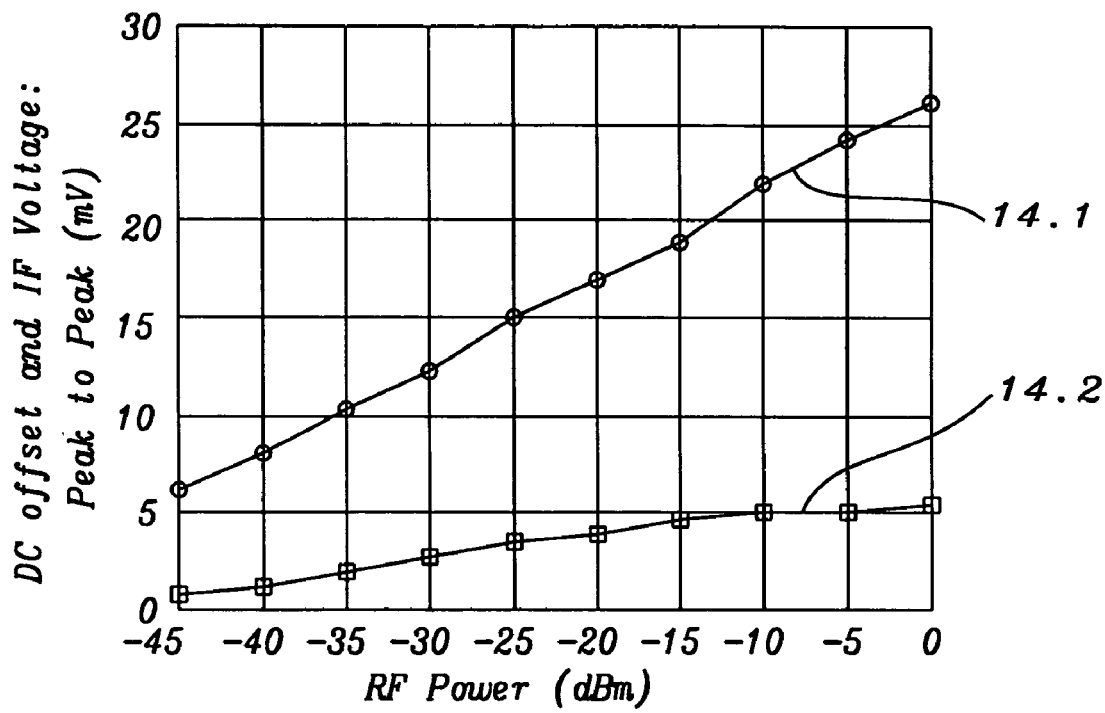
FIG. 14 is a graph of the measured IF output and DC offset of the symmetrical mixer of the present invention.

Measurement and Comparison Results:

Table 2 below and the graph of FIG. 14 show results for the symmetrical mixer as described above. The graph of FIG. 14 (with Curves 14.1 and 14.2) relates RF power (in dBm) vs. DC offset voltage (peak to peak in mV). For an RF frequency of 2.448 GHz and an IO frequency of 2.45 GHz, the desired IF output at 20 MHz is amplified linearly (Curve 14.1) and the undesired DC offset is limited to a small range and changes slightly with the increase of RF power (Curve 14.2).

TABLE 2 symmetrical mixer

| RF (2.448 GHz) dBm | LO (2.45 GHz) dBm | IF(20 MHz) | | |
|---|---|---|---|---|
| | | DC mV | Offset mV | Signal (P—P) mV |
| −45 | −5 | 967.4 | 0.6 | 6.18 |
| −40 | −5 | 967.8 | 1 | 8.13 |
| −35 | −5 | 968.4 | 1.6 | 10.37 |
| −30 | −5 | 969.2 | 2.4 | 12.25 |
| −25 | −5 | 970.3 | 3.5 | 15.03 |
| −20 | −5 | 970.8 | 4.0 | 16.84 |
| −15 | −5 | 971.6 | 4.8 | 19.20 |
| −10 | −5 | 971.8 | 5.0 | 22.02 |
| −5 | −5 | 972.4 | 5.2 | 24.26 |
| 0 | −5 | 972.6 | 5.4 | 26.03 |

Figure 15:
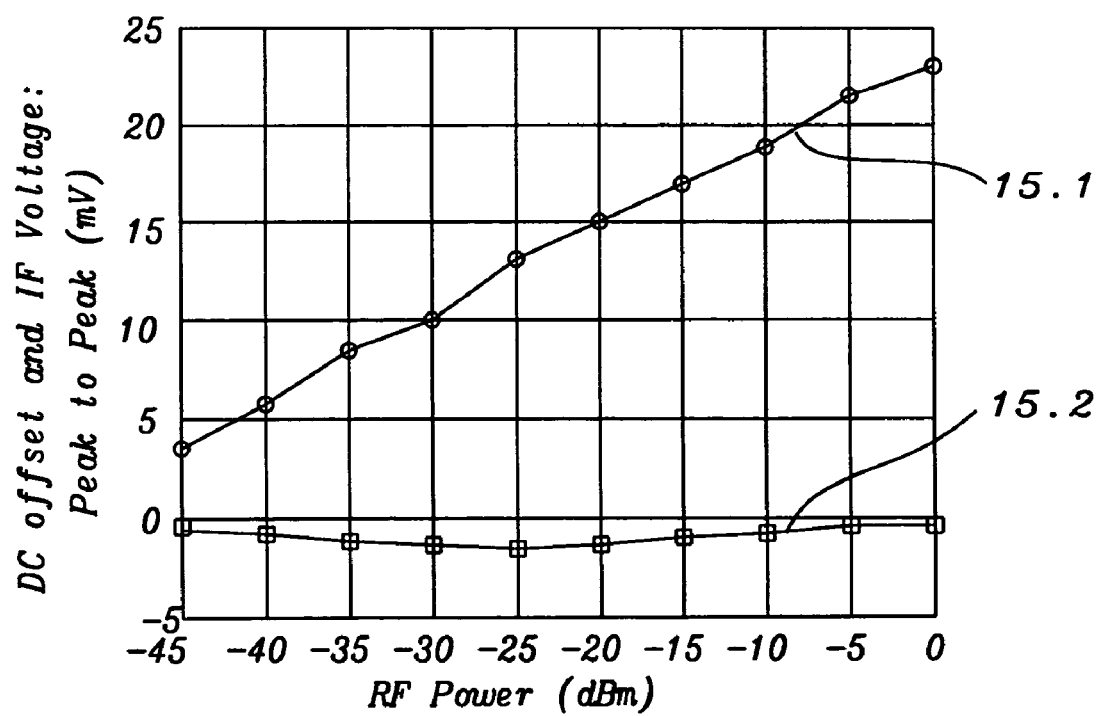
FIG. 15 is a graph of the measured IF output and DC offset of the tuned mixer of the present invention.

Table 3 below and the graph of FIG. 15 show results for the tuned mixer as described above. The graph of FIG. 15 (with Curves 15.1 and 15.2) relates RF power (in dBm) vs. DC offset voltage (peak to peak in mV). For an RF frequency of 2.448 GHz and an IO frequency of 2.45 GHz, the desired IF output at 20 MHz is amplified linearly (Curve 15.1) and the undesired DC offset is limited to a small range and does not changes with the increase of RF power (Curve 15.2).

Figure 16:
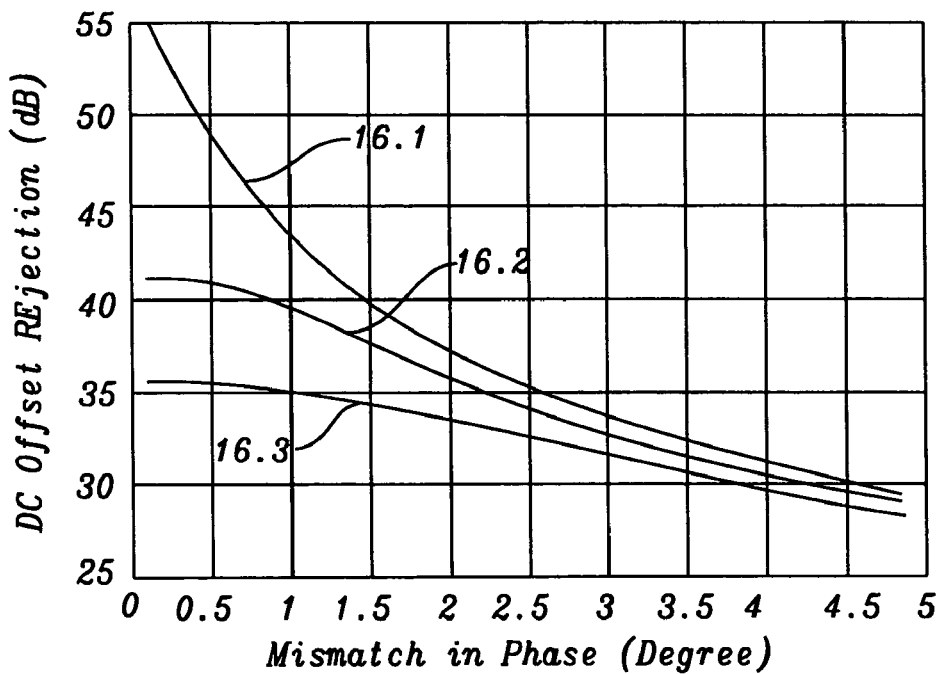
FIG. 16 is a graph of the DC offset rejection vs. phase mismatch of the symmetrical mixer of the present invention.

The graph of FIG. 16 shows the simulation results of the mismatch in phase (in degrees) vs. the DC offset rejection (in dB) for the symmetrical mixer. Curve 16.1 is the graph for leakage=−45 dBm, Curve 16.2 is the graph for leakage=−30 dBm, and Curve 16.3 is the graph for leakage=−20 dBm. Actual measurement results show a DC offset rejection >35 dB using a 0.35 um CMOS technology, at an RF signal=−50 dBm, and an LO signal=−5 dBm. These measurements imply a phase mismatch of <2 degrees at a DC rejection >35 dB and are in excellent agreement with the simulation results of FIG. 16.

Figure 17:
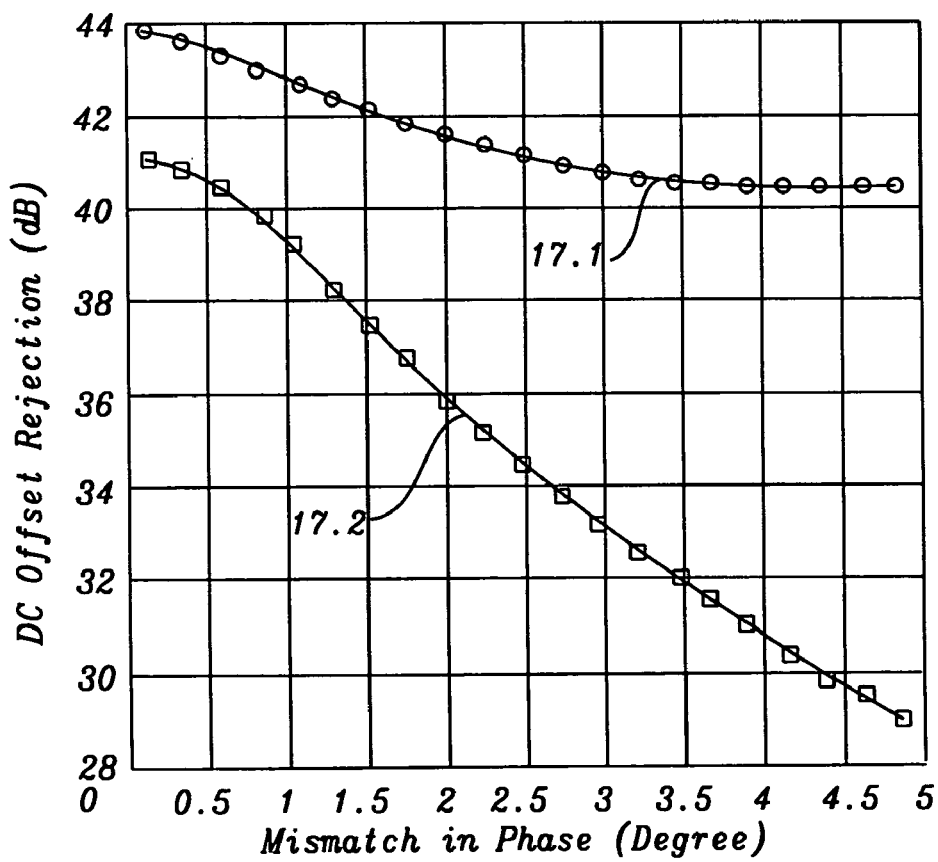
FIG. 17 is a graph of the DC offset rejection vs. phase mismatch of the tuned mixer of the present invention.

The graph of FIG. 17 compares the mismatch in phase (in degrees) vs. the DC offset rejection (in dB) of the tuned and the symmetrical mixer based on simulation results. The tuned mixer is Curve 17.1, the symmetrical mixer is Curve 17.2. The typical LO leakage is −30 dBm. The curves demonstrate that tuned mixers have better DC offset rejection than symmetrical mixers, and that the tuned mixer performance is almost unaffected by phase mismatch.

FIG. 18 is a block diagram of a conventional mixer of the prior art. An LNA with input X(t) drives two mixer which generate signals Y_I(t) and Y_Q(t) and couple to a buffer each. The buffer outputs are Z_I(t) and Z_Q(t). Table 4 below and the graph of FIG. 19 illustrate the performance of the mixer of FIG. 18. The graph of FIG. 19 (with Curves 19.1 and 19.2) relates the prior art RF power (in dBm) vs. DC offset voltage (peak to peak in mV). For an RF frequency of 2.448 GHz and an IO frequency of 2.45 GHz, the desired IF output at 20 MHz is nonlinear (Curve 19.1) and the undesired DC offset increases exponentially with the RF power (Curve 19.2). The DC offset even overwhelms the desired IF signal when RF>−10 dBm!

TABLE 3 tuned mixer

| RF (2.448 GHz) dBm | LO (2.45 GHz) dBm | IF(20 MHz) | | |
|---|---|---|---|---|
| | | DC mV | Offset mV | Signal (P—P) mV |
| −45 | −5 | 537.3 | −0.5 | 3.38 |
| −40 | −5 | 537.2 | −0.6 | 5.64 |
| −35 | −5 | 537.1 | −0.7 | 8.30 |
| −30 | −5 | 536.7 | −1.1 | 10.1 |
| −25 | −5 | 536.5 | −1.3 | 12.8 |
| −20 | −5 | 536.6 | −1.2 | 14.9 |
| −15 | −5 | 536.8 | −1.0 | 16.7 |
| −10 | −5 | 536.9 | −0.9 | 18.8 |
| −5 | −5 | 537.3 | −0.5 | 21.6 |
| 0 | −5 | 537.2 | −0.4 | 23.0 |

TABLE 4 conventional mixer

| RF (2.448 GHz) dBm | LO (2.45 GHz) dBm | IF(20 MHz) | | |
|---|---|---|---|---|
| | | DC mV | Offset mV | Signal (P—P) mV |
| −45 | −5 | 883.0 | 3.0 | 4.11 |
| −40 | −5 | 883.5 | 3.5 | 8.23 |
| −35 | −5 | 885.0 | 5.0 | 11.60 |
| −30 | −5 | 886.5 | 6.5 | 15.67 |
| −25 | −5 | 888.8 | 8.8 | 19.87 |
| −20 | −5 | 892.5 | 12.5 | 21.32 |
| −15 | −5 | 897.5 | 17.5 | 22.74 |
| −10 | −5 | 906.5 | 26.5 | 24.57 |
| −5 | −5 | 911.5 | 31.5 | 25.16 |
| 0 | −5 | 935.0 | 55.5 | 26.56 |

Table 5 below is a performance comparison between the proposed symmetrical mixer, the tuned mixer of the invention and a conventional mixer of the prior art (FIG. 18). Table 5 illustrates that the proposed mixers of the invention have comparable performance with a conventional mixer in gain, noise figure, current consumption. The proposed mixers have better IIP3 and P−1 dB performance than a conventional mixer. The proposed mixers have decidedly better DC offset rejection than a conventional mixer.

TABLE 5 performance comparison

| | Gain (dB) | Noise Figure (+LNA) (dB) | IIP3 (dBm) | RF power (dBm) | DC offset (mV) | IF Output (mV) | DC offset rejection (dB) | Current Consump. (mA) |
|---|---|---|---|---|---|---|---|---|
| Symmetrical Mixer | 5 | 6.5~7.5 | 10 | −50–0 | 0.6–5.8 | 6.18–21.3 | +35 | 8.6 |
| Tuned Mixer | 13.3 | 7~8 | 8 | −50–0 | 0.4–1.3 | 3.38–23.0 | +40 | 12 |
| Conventional Mixer | 13 | 6~6.5 | −7 | −50–0 | 3.0–55.0 | 4.11–26.56 | −30 | 8 |

Features

The essential features of the invented DC Offset-Free RF Front-End Circuit are as follows:
(a) a DC offset free RF front-end system comprising:
  a low noise amplifier to amplify a received RF signal;
  a first polyphase filter arrays to generate RF signals with phase offsets;
  a second polyphase filter array to generate LO signals with phase offsets;
  a first set of mixers in the I path to mix I signals;
  a second set of mixers in the Q path to mix Q signals; a first combiner to combine signals coming from a first mixer each of the first and second set of mixers, thus combining I and Q signals;
  a second combiner to combine signals coming from a second mixer each of the first and second set of mixers, thus combining I and Q signals;
(b) a DC offset tuning feedback tuning loop system comprising:
  an analog multiplier coupled to the first and second combiner, to form a detection signal generating a DC offset signal;
  a comparator to compare the DC offset signal against a threshold voltage, to generate a current tuning signal;
  two Gilbert cell mixers with variable gain using the current tuning signal.
(c) The detection signal identifies the strength of the DC offset.
(d) A preamplifier is coupled between the multiplier and the comparator to amplify the detection signal to drive the comparator.
(e) The Gilbert cell mixers eliminate the DC offset.

Figure 20:
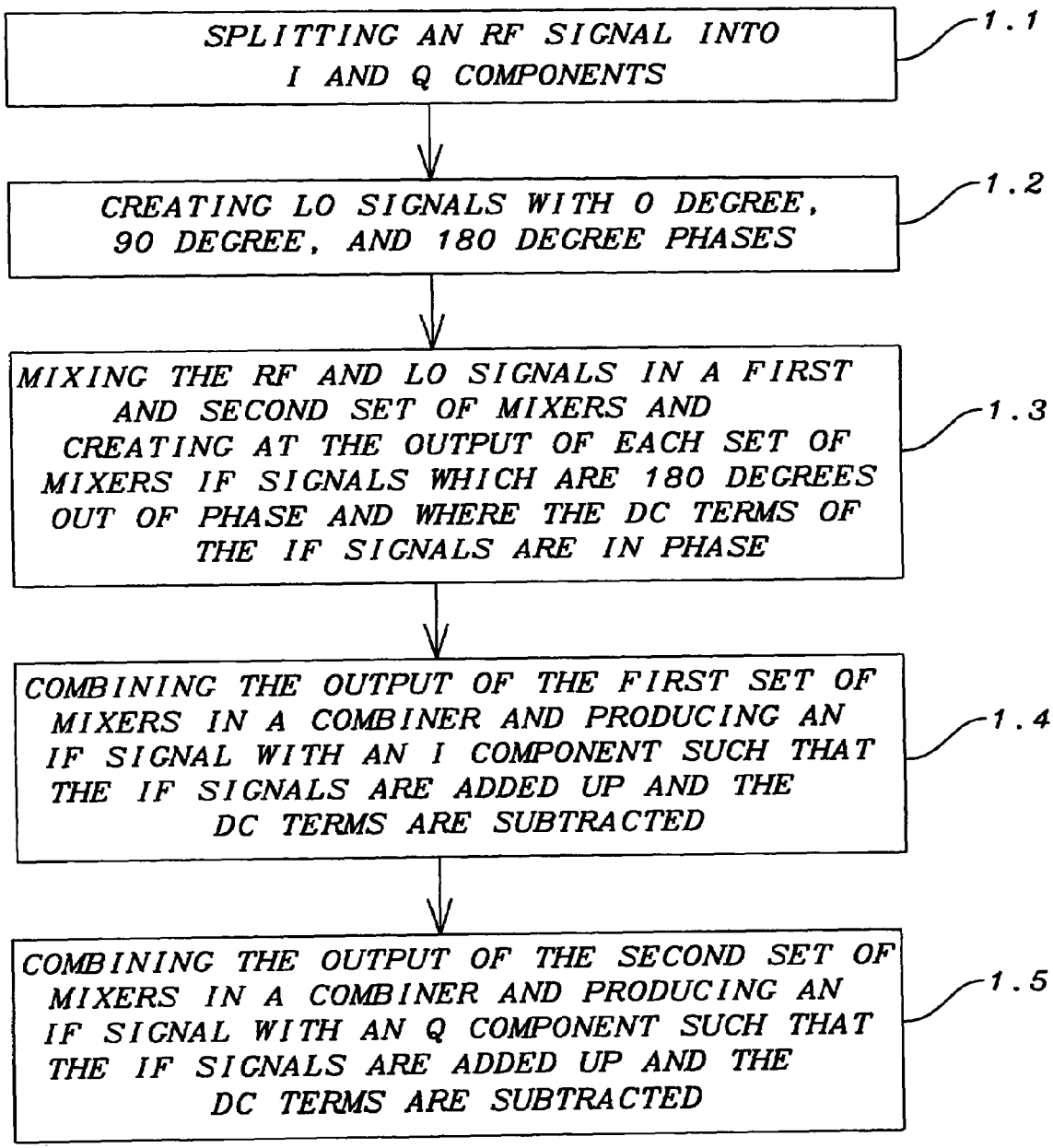
FIG. 20 is a block diagram of the method of creating a DCR front-end of the present invention.
Figure 21:
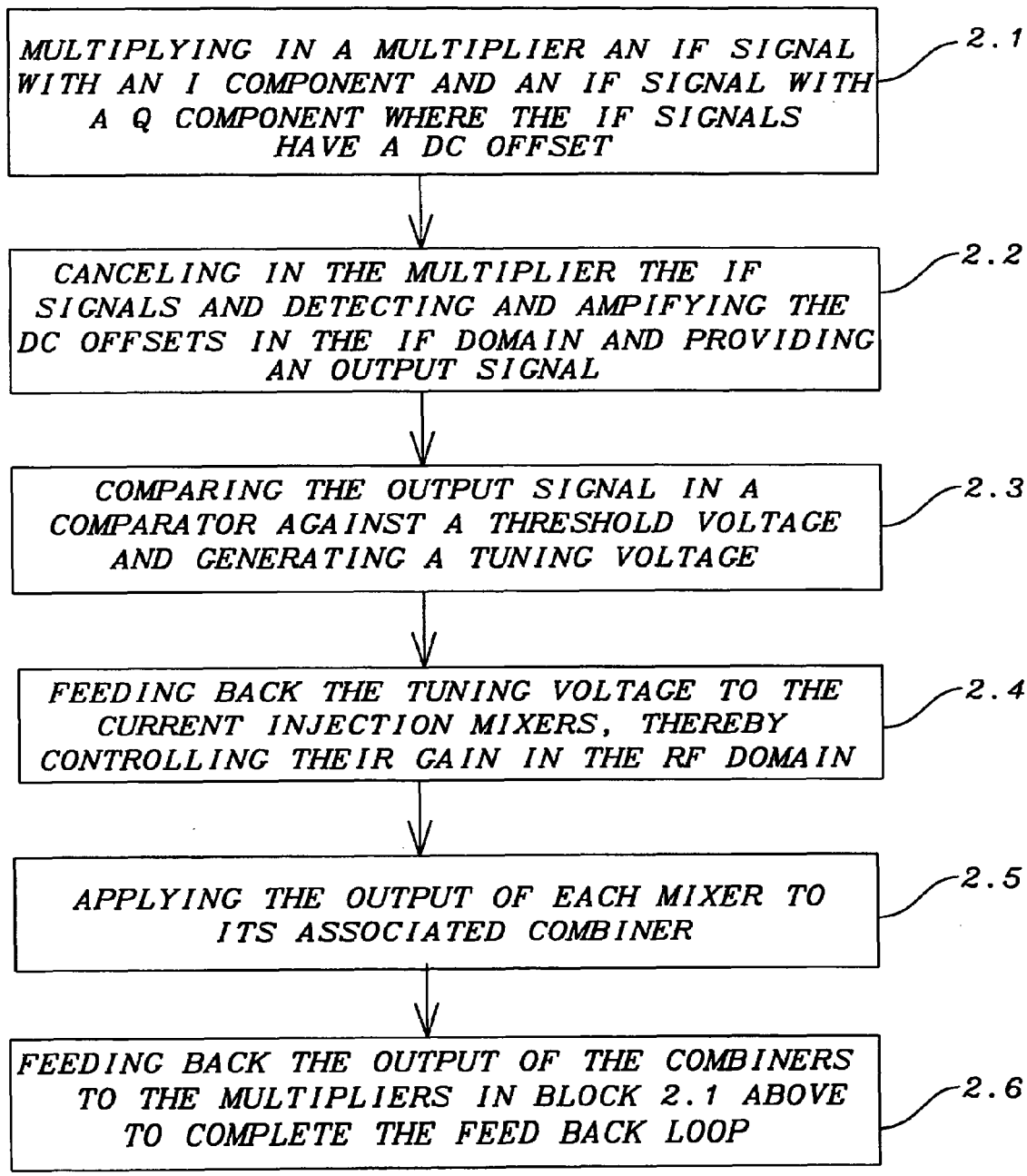
FIG. 21 is a block diagram of the method of creating a DC offset feedback tuning loop of the present invention.

We now describe the method of the invention with reference to FIG. 20 and FIG. 21. FIG. 20 is a block diagram of the method of creating a DCR front-end of the present invention.
In Block 1.1: splitting an RF signal into I and Q components;
in Block 1.2: creating LO signals with 0 degree, 90 degree, and 180 degree phases;
in Block 1.3: mixing the RF and LO signals in a first and second set of mixers and creating at the output of each set of mixers IF signals which are 180 degrees out of phase and where the DC terms of the IF signals are in phase;
in Block 1.4: combining the output of the first set of mixers in a combiner and producing an IF signal with an I component such that the IF signals are added up and the DC terms are subtracted;
in Block 1.5: combining the output of the second set of mixers in a combiner and producing an IF signal with a Q component such that the IF signals are added up and the DC terms are subtracted.

FIG. 21 is a block diagram of the method of creating a DC offset feedback tuning loop of the present invention.
In Block 2.1: multiplying in a multiplier an IF signal with an I component and an IF signal with a Q component where the IF signals have a DC offset;
in Block 2.2: canceling in the multiplier the IF signals and detecting and amplifying the DC offsets in the IF domain and providing an output signal;
in Block 2.3: comparing the output signal in a comparator against a threshold voltage and generating a tuning voltage;
in Block 2.4: feeding back the tuning voltage to the current injection mixers, thereby controlling their gain in the RF domain;
in Block 2.5: applying the output of each mixer to its associated combiner;
in Block 2.6: feeding back the output of the combiners to the multiplier in Block 1 of FIG. 21 to complete the feedback loop.

ADVANTAGES (1) DC offset can be canceled in RF front-end, thus simplifying the following IF circuit design.
(2) The system performance is reliable. Due to the symmetry of circuit and system, the large DC offset can be canceled. An adaptive tuning circuit is invented, which even can reduce the DC offset produced from process mismatch and circuit mismatch.
(3) Both the fixed and time-varying DC offset can be tracked and canceled, which ensure the high performance of the invention in practical environment and applications.
(4) A single fully integrated chipset can be implemented for direct conversion transceiver (DCT) applications. Conventional building block circuits such as Gilbert cell may be used and performance is reliable. Low cost implementation.
(5) No specific circuit design is necessary. No external tuning circuit is needed. No external big capacitor is required. High Performance and low cost circuit design are be achieved.

While the invention has been particularly shown and described with reference to the preferred embodiments thereof, it will be understood by those skilled in the art that various changes in form and details may be made without departing from the spirit and scope of the invention.

What is claimed is:

1. A DC offset-free direct conversion receiver RF front end, comprising:
   an I/Q splitting network receiving a radio-frequency signal X(t) and producing a first output signal Y_I(t) and a second output signal Y_Q(t), where said Y_Q(t) signal is 90 degrees out of phase from said Y_I(t) signal;
   a polyphase filter receiving a local oscillator signal X_LO(t), said polyphase filter having outputs producing output signals with 0 degree, 90 degree, and 180 degree phase differences relative to said local oscillator signal;
   mixers receiving said output signals of said I/Q splitting network and said output signals of said polyphase filter, said mixers having outputs producing intermediate-frequency signals with I and Q components; and
   combiner and buffer means having inputs and outputs, each of said inputs coupled to the output of one of said mixers, where at one output of said combiner and buffer means the I component intermediate-frequency signals are added, and the I component intermediate-frequency signal DC terms are subtracted, and where at another output of said combiner and buffer means the Q component intermediate-frequency signals are added and the Q component intermediate-frequency signal DC terms are subtracted.

2. The DC offset-free direct conversion receiver RF front end of claim 1, wherein addition of said I and Q component intermediate-frequency signals enhances said signals at said outputs of said combiner and buffer.

3. The DC offset-free direct conversion receiver RF front end of claim 1, wherein subtraction of said I and Q component intermediate-frequency signal DC terms cancels said DC terms at said outputs of said combiner and buffer.

4. The DC offset-free direct conversion receiver RF front end of claim 1, wherein the output intermediate-frequency signals of said mixers are 180 degrees out of phase and where the DC terms of the intermediate-frequency signals are in phase.

5. A DC offset-free direct conversion receiver RF front end, comprising:
   an I/Q splitting network receiving a radio-frequency signal X(t) and producing a first output signal Y_I(t) and a second output signal Y_Q(t), where said first output signal Y_I (t) and said second output signal Y_Q(t) are the I and Q components of said signal X(t), respectively, where said Q component is 90 degrees out of phase relative to said I component;
   a polyphase filter receiving a local oscillator signal X_LO(t), said polyphase filter having outputs producing a first output signal with a 90 degree phase difference, a second output signal with a 0 degree phase difference, a third output signal with a 180 degree phase difference, and a fourth output signal with a 90 degree phase difference relative to said local oscillator signal;
   a first mixer receiving said first output signal Y_I(t) and said first polyphase filter output signal, the output of said first mixer producing an I component intermediate-frequency signal;
   a second mixer receiving said first output signal Y_I(t) and said third polyphase filter output signal, the output of said second mixer producing an I component intermediate-frequency signal;
   a third mixer receiving said second output signal Y_Q(t) and said second polyphase filter output signal, the output of said third mixer producing a Q component intermediate-frequency signal;
   a fourth mixer receiving said second output signal Y_Q(t) and said fourth polyphase filter output signal, the output of said fourth mixer producing a Q component intermediate-frequency signal;
   a first combiner and buffer means having a first and a second input and an output, said first input coupled to the output said first mixer, said second input coupled to the output of said third mixer, where at said output the I component intermediate-frequency signals add up and the I component intermediate-frequency signal DC terms are subtracted; and
   a second combiner and buffer means having a first and a second input and an output, said first input coupled to the output said second mixer, said second input coupled to the output of said fourth mixer, where at said output the Q component intermediate-frequency signals add up and the Q component intermediate-frequency signal DC terms are subtracted.

6. The DC offset-free direct conversion receiver RF front end of claim 5, wherein said first, second, third, and fourth mixers are fully symmetrical mixers.

7. The DC offset-free direct conversion receiver RF front end of claim 5, wherein the outputs of said first and said second combiner and buffer means produce the difference between signals applied to said first and said second input.

8. The DC offset-free direct conversion receiver RF front end of claim 5, wherein said I and Q component intermediate-frequency signals are enhanced.

9. The DC offset-free direct conversion receiver RF front end of claim 5, wherein said I and Q component intermediate-frequency signal DC terms are canceled.

10. The DC offset-free direct conversion receiver RF front end of claim 5, wherein the output intermediate-frequency signals of said mixers are 180 degrees out of phase and where the DC terms of the intermediate-frequency signals are in phase.

11. A front-end DC offset feedback tuning loop to detect the DC offsets of intermediate-frequency signals having I and Q components and to cancel said DC offsets by feeding back a tuning voltage to current injection mixers, comprising:
   a multiplier coupled to combiner and buffer means, said multiplier sensing said DC offsets at its inputs and producing at its output an amplified DC offset;
   a comparator having a first input in communication with the output of said multiplier and a second input coupled to a threshold voltage, said comparator comparing the signal applied at its inputs and providing said tuning voltage at said comparator output; and
   said current injection mixers canceling said DC offsets by receiving RF signals, local oscillator signals, and said tuning voltage from said comparator, where said tuning voltage changes the conversion gain of said current injection mixers, the outputs of said current injection mixers coupled to the inputs of said combiner and buffer means.

12. The front-end DC offset feedback tuning loop of claim 11, wherein said intermediate-frequency signals with I and Q components having a 90 degree phase difference will be canceled at said output of said multiplier.

13. The front-end DC offset feedback tuning loop of claim 11, wherein said DC offset sensed by said multiplier is a time-varying DC offset.

14. The front-end DC offset feedback tuning loop of claim 11, wherein means are provided to determine the tuning sensitivity and convergence of said feedback tuning loop.

15. The front-end DC offset feedback tuning loop of claim 11, wherein said conversion gain of each of said current injection mixers changes linearly with said tuning voltage.

16. A front-end DC offset feedback tuning loop to detect the DC offsets of an intermediate-frequency signal with an I component and an intermediate-frequency signal with a Q component and to cancel said DC offsets by feeding back a tuning voltage, comprising:
   a multiplier having a first and a second input and outputs, said first input receiving said intermediate-frequency signal with an I component, said second input receiving said intermediate-frequency signal with an Q component, said multiplier sensing the time-varying DC offset at said first and second input and producing at said outputs amplified time-varying DC offsets;
   an adaptor having inputs and an output, said inputs coupled to said outputs of said multiplier, said adaptor providing a low frequency voltage gain ranging from 80 to 120 dB and converting said input signals to a single ended output signal;
   a limiter having an input and an output, said input receiving said single ended output signal of said adaptor, said limiter limiting at its output the magnitude of its input signal;
   a comparator having a first and a second input and an output, said first input coupled to the output of said limiter, said second input coupled to a threshold voltage, said comparator comparing the signal applied at said first input to the threshold voltage applied to said second input and providing a tuning voltage at said comparator output; and
   current injection mixers, each having a first, a second and a third input, and an output, said first input receiving an RF signal, said second input receiving a local oscillator signal and said third input receiving said tuning voltage of said comparator, where said tuning voltage changes the conversion gain of each of said current injection mixers thus canceling said DC offset, where each of said outputs of said current mixer injectors is coupled to the input of a combiner and buffer.

17. The front-end DC offset feedback tuning loop of claim 16, wherein the multiplied value of said intermediate-frequency signal with an I component and a Q component and having a 90 degree phase difference, when applied to said multiplier will be canceled at said output of said multiplier.

18. The front-end DC offset feedback tuning loop of claim 16, wherein said adaptor determines the tuning sensitivity and convergence of said feedback tuning loop.

19. The front-end DC offset feedback tuning loop of claim 16, wherein said conversion gain of each of said current injection mixers changes linearly with said tuning voltage.

20. The front-end DC offset feedback tuning loop of claim 16, wherein said DC offset is tracked and canceled in real time.

21. A DC offset-free RF front-end circuit, comprising:
   an RF front-end system, further comprising:
      a low noise amplifier to amplify a received RF signal;
      a first polyphase filter array coupled to said low noise amplifier to generate I and Q signals;
      a second polyphase filter array to generate LO signals with phase offsets;
      a first set of mixers in the I path to mix I signals with a first group of said LO signals;
      a second set of mixers, having variable gain, in the Q path to mix Q signals with a second group of said LO signals;
   a first combiner to combine signals coming from a first mixer of each of said first and second set of mixers, thus combining I and Q signals;
   a second combiner to combine signals coming from a second mixer of each of said first and second set of mixers, thus combining I and Q signals;
   a DC offset tuning feedback tuning loop system, further comprising:
      an analog multiplier coupled to said first and second combiner, to form a detection signal generating a DC offset signal;
      a comparator to compare said DC offset signal against a threshold voltage, to generate a current tuning signal; and
      where said second set of mixers with variable gain are Gilbert cell mixers coupled to said current tuning signal.

22. The DC offset-free RF front-end circuit of claim 21, wherein said detection signal identifies the strength of said DC offset.

23. The DC offset-free RF front-end circuit of claim 21, wherein an adaptor is coupled between said multiplier and said comparator to provide tuning sensitivity and convergence for said feedback tuning loop.

24. The DC offset-free RF front-end circuit of claim 21, wherein said Gilbert cell mixers eliminate said DC offset.

25. A DC offset-free RF front-end circuit, comprising:
   a DC offset-free direct conversion receiver RF front end, further comprising:
      an I/Q splitting network receiving a radio-frequency signal X(t) splitting said signal X(t) into output signals X_I(t) and X_Q(t);
      a polyphase filter receiving a local oscillator signal X_LO(t), having outputs producing output signals having phase differences relative to said local oscillator signal;
      a first set of mixers coupled to said output signal X_I(t) and said polyphase filter, said mixers having outputs producing intermediate-frequency signals with an I component;
      a second set of mixers coupled to said output signal X_Q(t) and said polyphase filter, said mixers having outputs producing intermediate-frequency signals with a Q component, said second set of mixers further coupled to the output of a comparator;
      a combiner and buffer coupled to the outputs of said first and second set of mixers, where a first output of said combiner and buffer produces a DC-free I component intermediate-frequency signal and where a second output of said combiner and buffer produces a DC-free Q component intermediate-frequency signal;
   a feedback tuning loop to cancel a DC offset of said I and Q component intermediate-frequency signals, said feedback tuning loop further comprising:
      a multiplier coupled to said outputs of said combiner and buffer to amplify said DC offset;
      an adaptor/limiter coupled to the output of said multiplier to limit and further amplify said DC offset;
      said comparator having a first and a second input, said first input coupled to the output of said adaptor/limiter; to compare said first input against said second input, said comparator producing a tuning voltage at its output; and said second set of mixers receiving said tuning voltage from said comparator.

26. The DC offset-free RF front-end circuit of claim 25, wherein said I/Q splitting network receives a radio-frequency signal X(t) and producing a first output signal Y_I(t) and a second output signal Y_Q(t), where said Y_Q(t) signal is 90 degrees out of phase from said Y_I(t) signal.

27. The DC offset-free RF front-end circuit of claim 25, wherein said polyphase filter receives a local oscillator signal X_LO(t), said polyphase filter having outputs producing output signals with 0 degree, 90 degree, and 180 degree phase differences relative to said local oscillator signal.

28. The DC offset-free RF front-end circuit of claim 25, wherein said first set of mixers produces intermediate-frequency signals with I and Q components.

29. The DC offset-free RF front-end circuit of claim 25, wherein said second set of mixers produces intermediate-frequency signals with I and Q components, where said tuning voltage changes the conversion gain of said second set of mixers.

30. The DC offset-free RF front-end circuit of claim 25, wherein at said first output of said combiner and buffer the I component intermediate-frequency signals are added, and the I component intermediate-frequency signal DC terms are subtracted.

31. The DC offset-free RF front-end circuit of claim 25, wherein at said second output of said combiner and buffer the Q component intermediate-frequency signals are added and the Q component intermediate-frequency signal DC terms are subtracted.

32. The DC offset-free RF front-end circuit of claim 25, wherein said multiplier is coupled to said combiner and buffer, said multiplier sensing the DC offset at its inputs and producing at its output an amplified DC offset.

33. The DC offset-free RF front-end circuit of claim 25, wherein said adaptor/limiter is coupled to the output of said multiplier, said adaptor/limiter further amplifying the output signal of said multiplier and providing a signal for tuning the gain of current injection mixers.

34. The DC offset-free RF front-end circuit of claim 25, wherein said second input of said comparator is coupled to a threshold voltage.

35. The method of providing a DC offset-free DCR RF front-end system, comprising the steps of:
   1) splitting an RF signal into I and Q components;
   2) creating LO signals with 0 degree, 90 degree, and 180 degree phases;
   3) mixing the RF and LO signals in a first and second set of mixers and creating at the output of each set of mixers IF signals which are 180 degrees out of phase and where the DC terms of the IF signals are in phase;
   4) combining the output of the first set of mixers in a combiner and producing an IF signal with an I component such that the IF signals are added up and the DC terms are subtracted; and
   5) combining the output of the second set of mixers in a combiner and producing an IF signal with a Q component such that the IF signals are added up and the DC terms are subtracted.

36. The method of providing a DC offset-free DCR RF front-end system of claim 35, wherein said first and second set of mixers are fully symmetrical mixers.

37. The method of providing a DC offset-free DCR RF front-end system of claim 35, wherein subtraction of said DC terms at the outputs of said combiners cancels said DC terms.

38. The method of providing a DC offset-free DCR RF front-end system of claim 35, wherein said IF signal with a Q component has a 90 degree offset from said IF signal with an I component.

39. The method of providing a DC offset feedback tuning loop, comprising the steps of:
   1) multiplying in a multiplier an IF signal with an I component and an IF signal with a Q component where the IF signals have a DC offset;
   2) canceling in the multiplier the IF signals and detecting and amplifying the DC offsets in the IF domain and providing an output signal;
   3) comparing the output signal in a comparator against a threshold voltage and generating a tuning voltage;
   4) feeding back the tuning voltage to the current injection mixers, thereby controlling their gain in the RF domain;
   5) applying the output of each mixer to its associated combiner; and
   6) feeding back the output of the combiners to the multiplier in step 1) to complete the feedback loop.

40. The method of providing a DC offset feedback tuning loop of claim 39, wherein said IF signal with a Q component has a 90 degree offset from said IF signal with an I component.

41. The method of providing a DC offset feedback tuning loop of claim 39, wherein said mixers are fully symmetrical mixers.

42. The method of providing a DC offset feedback tuning loop of claim 39, wherein said mixers receive a LO signal with a phase of 0 degrees and 90 degrees, respectively, and a RF signal with a Q component.

* * * * *